(12) United States Patent
Hamamoto et al.

(10) Patent No.: US 12,426,160 B2
(45) Date of Patent: Sep. 23, 2025

(54) PRINTED WIRING BOARD AND INFORMATION PROCESSING APPARATUS

(71) Applicant: Hitachi, Ltd., Tokyo (JP)

(72) Inventors: Goro Hamamoto, Tokyo (JP); Keisuke Yamamoto, Tokyo (JP); Yutaka Uematsu, Tokyo (JP); Shinsuke Onoe, Tokyo (JP); Yohei Oshima, Tokyo (JP)

(73) Assignee: HITACHI, LTD., Tokyo (JP)

( * ) Notice: Subject to any disclaimer, the term of this patent is extended or adjusted under 35 U.S.C. 154(b) by 196 days.

(21) Appl. No.: 18/223,679

(22) Filed: Jul. 19, 2023

(65) Prior Publication Data
US 2024/0080979 A1    Mar. 7, 2024

(30) Foreign Application Priority Data

Sep. 1, 2022 (JP) ................. 2022-139126

(51) Int. Cl.
  *H05K 1/02* (2006.01)
  *H05K 1/11* (2006.01)

(52) U.S. Cl.
  CPC ........... *H05K 1/115* (2013.01); *H05K 1/0215* (2013.01); *H05K 2201/10159* (2013.01)

(58) Field of Classification Search
  CPC .... H05K 1/0215; H05K 1/115; H05K 1/0222; H05K 1/0218; H05K 1/114;
  (Continued)

(56) References Cited

U.S. PATENT DOCUMENTS

2006/0232301 A1* 10/2006 Morlion ................. H05K 1/114
                                                                                    326/126
2008/0078571 A1*  4/2008 Imaoka ................. H05K 1/0245
                                                                                    174/262
(Continued)

FOREIGN PATENT DOCUMENTS

JP     2006-245393 A    9/2006
JP     2013-93521       5/2013

OTHER PUBLICATIONS

Extended European Search Report received in corresponding European Application No. 23191078.7 dated Jan. 31, 2024.
(Continued)

*Primary Examiner* — Roshn K Varghese
(74) *Attorney, Agent, or Firm* — Mattingly & Malur, PC

(57) ABSTRACT

There is provided a printed wiring board including an outermost conductive layer that includes a plurality of conductive pads, a first conductive layer that includes a first inner-layer wiring and is stacked on the conductive layer, a second conductive layer that includes a second inner-layer wiring and is stacked on the conductive layer and the first conductive layer, a first signal via that connects one of the conductive pads and the first inner-layer wiring with each other, a second signal via connecting another one of the conductive pads and the second inner-layer wiring with each other, and a stitching via that is connected to a ground. The first inner-layer wiring and the second inner-layer wiring form a common wiring route in which the first inner-layer wiring and the second inner-layer wiring are stacked and disposed in a connection area in which the conductive pads are arranged.

8 Claims, 18 Drawing Sheets

(58) Field of Classification Search
CPC .. H05K 1/0251; H05K 1/0245; H05K 1/0228;
H05K 2201/010159; H05K 2201/097;
H05K 2201/10734; H05K 2201/09236;
H05K 2201/09609; H05K 2201/09636;
H05K 2201/09672; H05K 2201/09227
See application file for complete search history.

(56) References Cited

U.S. PATENT DOCUMENTS

| | | |
|---|---|---|
| 2009/0315158 A1 | 12/2009 | Maetani |
| 2013/0175077 A1* | 7/2013 | Kim ........................ H05K 1/114 |
| | | 174/262 |
| 2013/0214397 A1 | 8/2013 | Kawai |
| 2015/0319845 A1 | 11/2015 | Numagi et al. |

OTHER PUBLICATIONS

Japanese Office Action received in corresponding Japanese Application No. 2022-139126 dated Nov. 5, 2024.
Japanese Office Action received in corresponding Japanese Application No. 2022-139126 dated Feb. 18, 2025.

* cited by examiner $$[Lm] = \iint_{0\ d1}^{h\ d2} \frac{\mu}{2\pi r} drdz + \iint_{0\ R}^{h\ d3} \frac{\mu}{2\pi r} drdz$$

$$= \frac{\mu h}{2\pi}\left[-\ln\left(\frac{d2}{d1}\right) + \ln\left(\frac{d3}{R}\right)\right]$$

$$= \frac{\mu h}{2\pi}\ln\left(\frac{d1 \cdot d3}{d2 \cdot R}\right) \quad \cdots \text{EXPRESSION (1)}$$

PRINTED WIRING BOARD AND INFORMATION PROCESSING APPARATUS

CROSS-REFERENCE TO RELATED APPLICATION

The present application claims priority from Japanese application JP2022-139126, filed on Sep. 1, 2022, the contents of which is hereby incorporated by reference into this application.

BACKGROUND OF THE INVENTION

1. Field of the Invention

The present invention relates to a printed wiring board and an information processing apparatus.

2. Description of the Related Art

A memory device mounted on an information processing apparatus includes, for example, a plurality of synchronous dynamic random access memories (SDRAMs) and a memory controller (controller LSI: Large Scale Integration) that controls writing and reading of the SDRAMs. The plurality of SDRAMs and the memory controller are attached to a printed wiring board. An address (Add), a command (Cmd), and a control (Ctrl) signal are transmitted from the memory controller to each SDRAM via a wiring pattern referred to as a multi-drop wiring, which is formed on the printed wiring board.

As a technique related to such an information processing apparatus, there is a technique disclosed in JP 2006-245393 A below. JP 2006-245393 A discloses that "since the wiring of an address/command system (RTcmd/add) is routed to cross both DDR-SDRAMs 4 and 5 after detouring in a direction of one of the DDR-SDRAM 5, it is possible to reduce the crossing with the wiring of a data system (RTdq/dqs)".

SUMMARY OF THE INVENTION

However, in the printed wiring board on which the memory such as the SDRAM described above is mounted, it is necessary to further increase the speed and capacity while improving the performance of the information processing apparatus. In order to achieve such needs, it is required to secure the more voltage margin against external noise including crosstalk.

Therefore, an object of the present invention is to provide a printed wiring board and an information processing apparatus capable of realizing a stable operation even with a high speed and a large capacity, by reducing an occurrence of crosstalk.

In order to solve the above problems, for example, configurations described in the claims are adopted.

The present application includes a plurality of means for solving the above problems. As an example, there is provided a printed wiring board including an outermost conductive layer that includes a plurality of conductive pads, a first conductive layer that includes a first inner-layer wiring and is stacked on the outermost conductive layer, a second conductive layer that includes a second inner-layer wiring and is stacked on the conductive layer and the first conductive layer, a first signal via that connects one of the conductive pads and the first inner-layer wiring with each other, a second signal via connecting another one of the conductive pads and the second inner-layer wiring with each other, and/or a stitching via that is connected to a ground. The first inner-layer wiring and the second inner-layer wiring form a common wiring route in which the first inner-layer wiring and the second inner-layer wiring are stacked and disposed in a connection area in which the conductive pads are arranged.

According to the present invention, it is possible to provide a printed wiring board and an information processing apparatus capable of realizing a stable operation even with a high speed and a large capacity, by reducing an occurrence of crosstalk.

DESCRIPTION OF THE PREFERRED EMBODIMENTS

Hereinafter, embodiments of the present invention will be described in detail with reference to the drawings. Constituent elements common in the embodiments are denoted by the same reference signs, and a part of the repetitive description will be omitted.

<<Overall Configuration of Information Processing Apparatus>>

First Example

Figure 1:
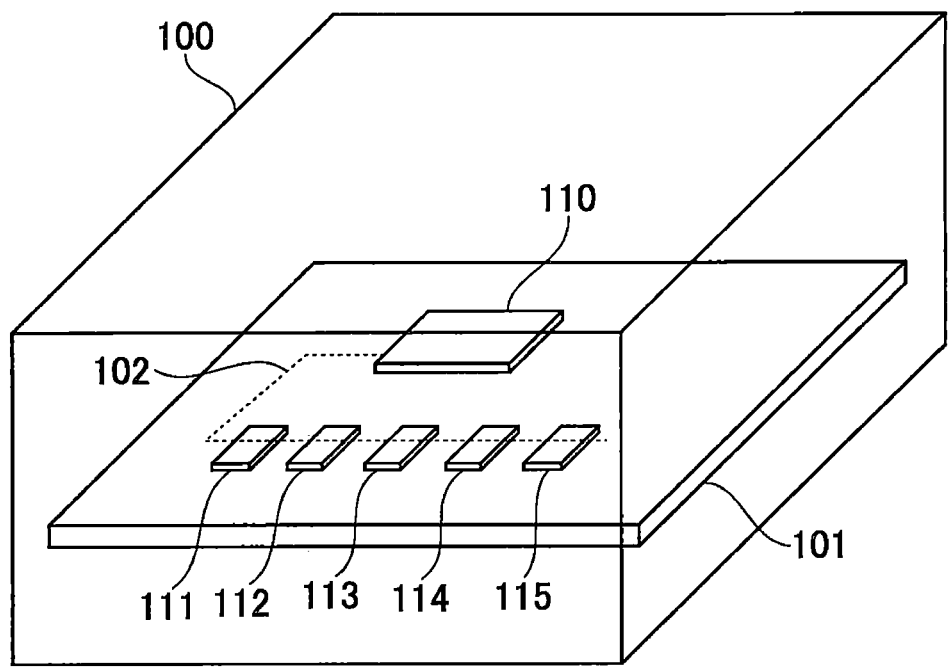
FIG. 1 is a schematic configuration diagram illustrating a first example of an information processing apparatus including a printed wiring board to which the present invention is applied.

FIG. 1 is a schematic configuration diagram illustrating a first example of an information processing apparatus including a printed wiring board to which the present invention is applied. An information processing apparatus 100 illustrated in FIG. 1 includes a printed wiring board 101. One memory controller 110 and a plurality of memory elements 111 to 115 are directly mounted on the printed wiring board 101. Although FIG. 1 illustrates a state in which the plurality of memory elements 111 to 115 are mounted only on one main surface side of the printed wiring board 101, the plurality of memory elements may be mounted on both surfaces of the printed wiring board 101.

The memory controller 110 is connected to the memory elements 111 to 115 by, for example, a multi-drop wiring 102. Each of the memory elements 111 to 115 is a double-data-rate SDRAM (DDR SDRAM), and the memory controller 110 controls writing and reading of data in and from each of the memory elements 111 to 115. In order to perform such control, an address, a command, and a control signal are transmitted from the memory controller 110 to each of the memory elements 111 to 115 via the multi-drop wiring 102.

Second Example

Figure 2:
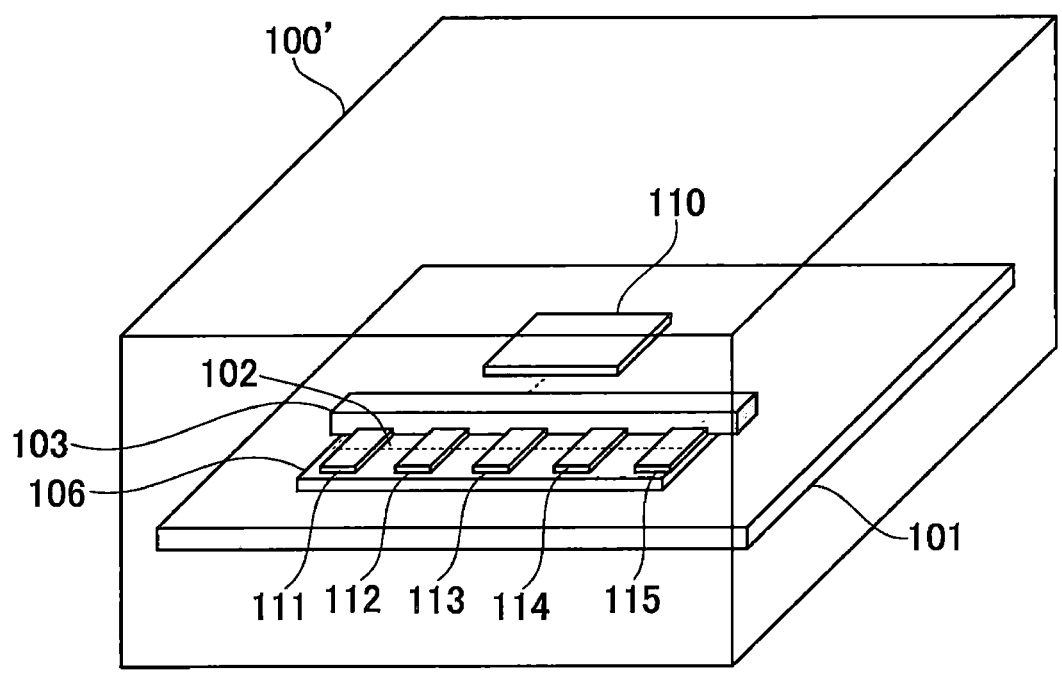
FIG. 2 is a schematic configuration diagram illustrating a second example of the information processing apparatus including the printed wiring board to which the present invention is applied.

FIG. 2 is a schematic configuration diagram illustrating a second example of the information processing apparatus including the printed wiring board to which the present invention is applied. In an information processing apparatus 100' illustrated in FIG. 2, a connector 103 is attached to a printed wiring board 101. A plurality of memory elements 111 to 115 mounted on a sub-board 106 are connected to the connector 103. The sub-board 106 on which the plurality of memory elements 111 to 115 are mounted as described above is referred to as a dual inline memory module (DIMM) card or the like. A memory controller 110 is directly mounted on the printed wiring board 101.

Similarly to the information processing apparatus 100 illustrated in FIG. 1, in the information processing apparatus 100' illustrated in FIG. 2, the plurality of memory elements 111 to 115 may be mounted on both surfaces of the printed wiring board 101 via the sub-board 106.

Furthermore, also in the information processing apparatus 100' illustrated in FIG. 2, as an example, an address, a command, and a control signal are branched in the sub-board 106 and transmitted from the memory controller 110 to each of the memory elements 111 to 115 via the multi-drop wiring 102.

<Schematic Configuration of Printed Wiring Board>

Figure 3:
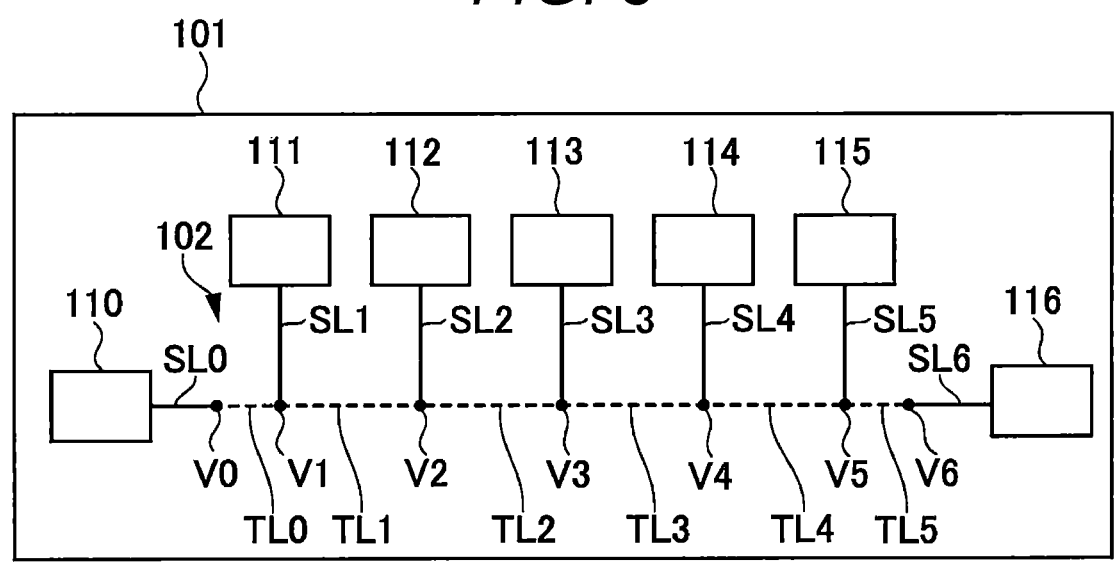
FIG. 3 is a diagram illustrating a multi-drop wiring topology to which the present invention is applied.

FIG. 3 is a diagram illustrating a multi-drop wiring topology to which the present invention is applied. A multi-drop wiring 102 in this example may be applied to either a case where the memory elements 111 to 115 are directly mounted on the printed wiring board 101 as illustrated in FIG. 1 or a case where the memory elements 111 to 115 are mounted on the printed wiring board 101 via the connector 103 and the sub-board 106 as illustrated in FIG. 2.

As illustrated in FIG. 3, the memory controller 110 is connected to the starting end (one end) side of the multi-drop wiring 102, and a termination resistor 116 (not illustrated in FIGS. 1 and 2) is connected to the termination (the other end) side of the multi-drop wiring 102. Each of the memory elements 111 to 115 is connected to the intermediate portion as a signal receiving element. The multi-drop wiring 102 as described above includes lead-in wirings SL0 to SL6 connected to the memory controller 110, the memory elements 111 to 115, and the termination resistor 116. The multi-drop wiring 102 further includes signal transmission vias V0 to V6 connected to the respective lead-in wirings SL0 to SL6 and signal lines TL0 to TL5 connecting the respective signal transmission vias V0 to V6. Although FIG. 3 illustrates only one set of wirings as the multi-drop wiring topology, the multi-drop wiring 102 is provided corresponding to signal lines for an address, a command, a control signal, and the like.

Figure 4:
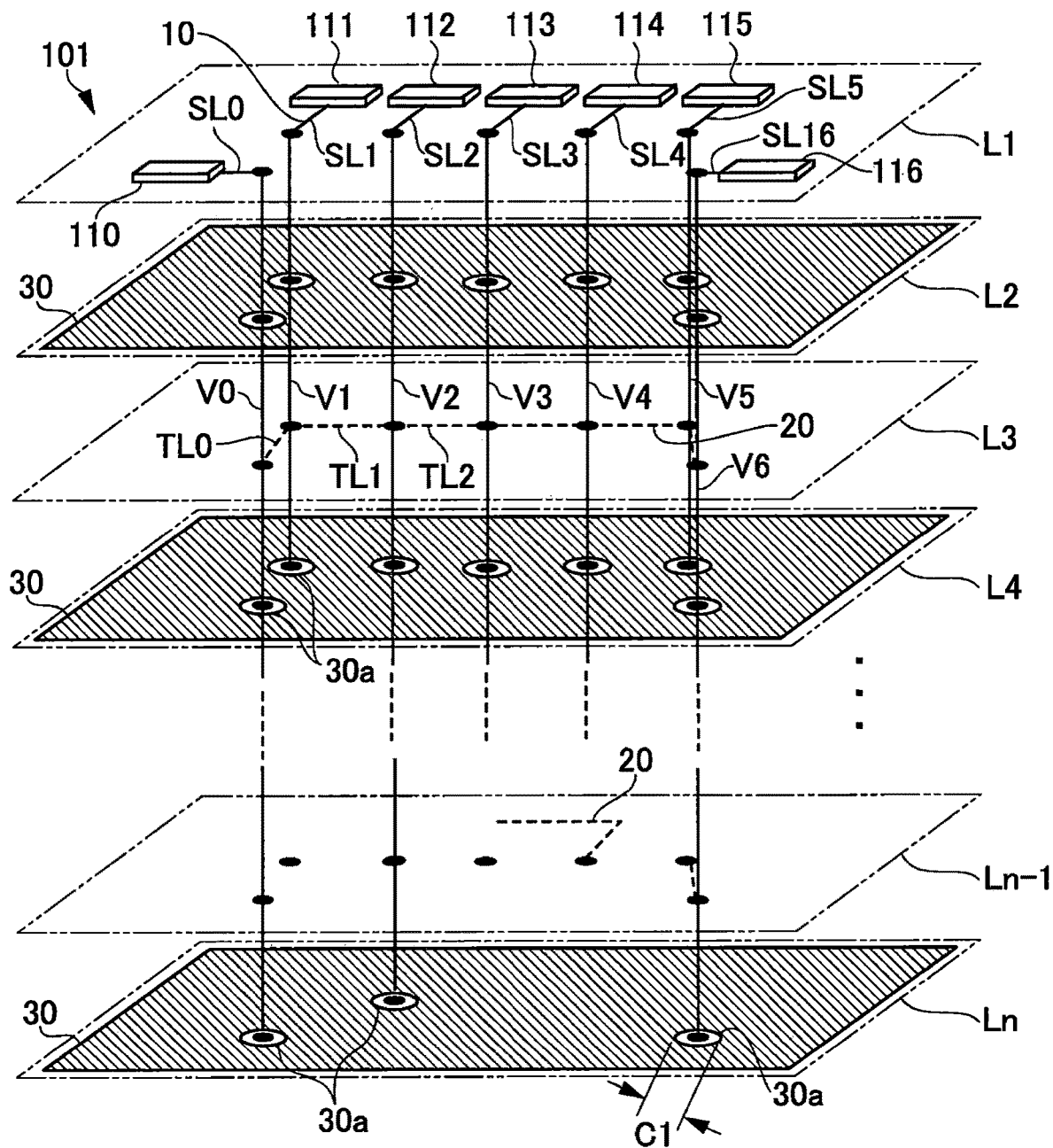
FIG. 4 is an exploded perspective view for explaining a layer structure of the printed wiring board to which the present invention is applied.

FIG. 4 is an exploded perspective view for explaining a layer structure of the printed wiring board to which the present invention is applied. Thee printed wiring board 101 on which multi-drop wiring 102 is provided includes a plurality of conductive layers L1 to Ln. Each of the conductive layers L1 to Ln is a layer formed on the front surface and the back surface of each insulating substrate (not illustrated). The outermost conductive layer L1 on the one main surface side of the printed wiring board 101 includes an outer-layer wiring 10 including the lead-in wirings SL0 to SL6.

In the conductive layers L2 to Ln−1 in the intermediate portion of the printed wiring board 101 and the outermost conductive layer Ln on the other main surface side, the inner-layer wiring 20 including the signal lines TL0 to TL5 is provided, or a solid film-like conductive film 30 is provided.

The solid film-like conductive film 30 is used as, for example, a power supply or a ground, and thus may be patterned with a certain area. The solid film-like conductive film 30 is preferably disposed to sandwich one or two conductive layers including the inner-layer wiring 20. When the solid film-like conductive film 30 is disposed to sandwich two conductive layers including the inner-layer wiring 20, it is preferable that the two conductive layers are disposed at a large interval and disposed close to each solid film-like conductive film 30. This makes it possible to prevent an occurrence of crosstalk between the inner-layer wirings 20 disposed in different conductive layers. When a plurality of memory elements are mounted on both surfaces of the printed wiring board 101, the outermost conductive layer Ln on the other main surface side is a layer having an outer-layer wiring 10 including the lead-in wiring.

The printed wiring board 101 includes the signal transmission vias V1 to V6 for connecting the outer-layer wiring 10 and the inner-layer wiring 20 to each other. Each of the solid film-like conductive films 30 has an opening 30a that is slightly larger than the signal transmission vias V1 to V6, in order to secure insulation with the signal transmission vias V1 to V6.

Figure 5:
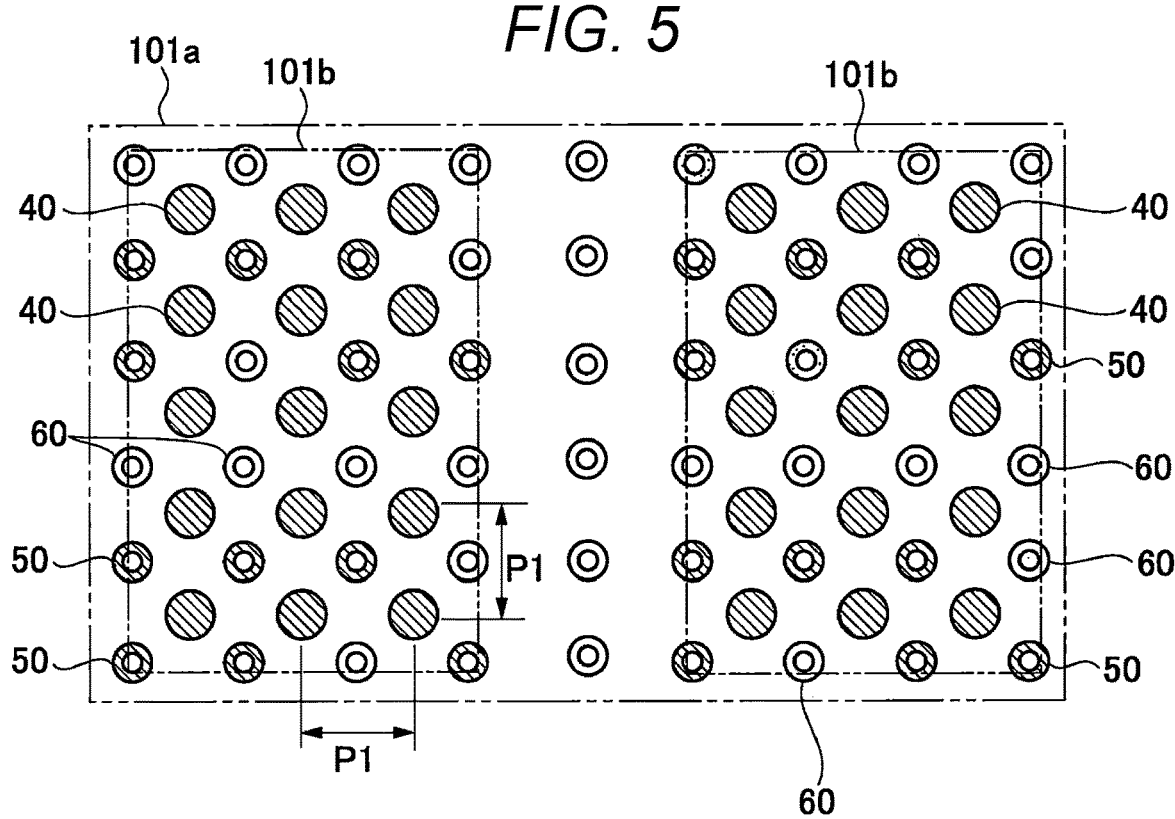
FIG. 5 is a plan view of an element mounting area of the printed wiring board to which the present invention is applied.

FIG. 5 is a plan view of an element mounting area of the printed wiring board to which the present invention is applied, and is a plan view of an element mounting area 101a for mounting one element of elements such as the memory controller 110 and the memory element 111 to 115 illustrated in FIGS. 1 to 4. As illustrated in FIG. 5, a plurality of conductive pads 40 are arranged in the element mounting area 101a of the printed wiring board. Each of the conductive pads 40 is a pad for connecting an element and the printed wiring board 101.

Here, it is assumed that the elements such as the memory controller 110 and the memory element 111 to 115 illustrated in FIGS. 1 to 4 have a package structure of a ball grid array (BGA) type. In this case, bonding balls are arranged in a matrix on the bottom surface of each element. When the elements are SDRAMs, the bonding balls are arranged in accordance with the pitch arrangement defined in the JEDEC Standard, and for example, the arrangement having a pitch of 0.8 mm is provided in DDR4. In this case, it is assumed that the conductive pads 40 provided in each element mounting area 101a of the printed wiring board are arranged in a matrix corresponding to the arrangement of the bonding balls, and are arranged at the same arrangement pitch P1 in a matrix direction, for example. The arrangement pitch P1 is, for example, 0.8 mm.

In the example illustrated in FIG. 5, two places in the element mounting area 101a serve as connection areas 101b in which the conductive pads 40 are arranged.

In addition, a plurality of signal vias 50 and stitching vias 60 are provided in the element mounting area 101a. Each of the signal vias 50 corresponds to, for example, any of the signal transmission vias V0 to V6 illustrated in FIGS. 3 and 4. As an example, when the element mounting area 101a is an area on which the memory element 111 illustrated in FIGS. 3 and 4 is mounted, each signal via 50 is the signal transmission via V1 illustrated in FIGS. 3 and 4. In addition, the stitching via 60 is a via for securing a return path of the adjacent signal via 50, and is a ground via connected to the ground (or a power supply).

The signal via 50 and the stitching via 60 are either through-vias that penetrate the printed wiring board 101 or vias that penetrate only some layers of the printed wiring board 101. Such a signal via 50 and a stitching via 60 are not limited to the through-via by the drill method, and may have any of various general and inexpensive via structures represented by the laser method, the B2IT method, and the pad-on-via by filling the through-via, or may have other structures.

The signal vias 50 and the stitching vias 60 are arranged inside and outside the connection area 101b, and are arranged between the arrangements of the conductive pads 40 in the connection area 101b in which the conductive pads 40 are arranged. The signal via 50 and the stitching via 60 may be arranged in a matrix as illustrated, between the arrangements of the conductive pads 40, or may be arranged only in some necessary pads thereof. The layout of a wiring including the signal via 50 and the stitching via 60 in the connection area 101b will be described in detail in each of the following embodiments.

In the element mounting area 101a of the outermost layer of the printed wiring board, in addition to the conductive pads 40, the signal vias 50, and the stitching vias 60 described above, any of the lead-in wirings SL0 to SL5 illustrated in FIGS. 3 and 2 is provided, but the illustration of the lead-in wirings SL0 to SL5 in FIG. 5 is omitted.

An embodiment of a wiring structure of a printed wiring board including the outer-layer wiring 10 forming the lead-in wirings SL0 to SL5, the inner-layer wiring 20 forming the signal lines TL0 to TL5, the signal vias 50 corresponding to the signal transmission vias V1 to V6, and the stitching vias 60 will be described below.

First Embodiment

Figure 6:
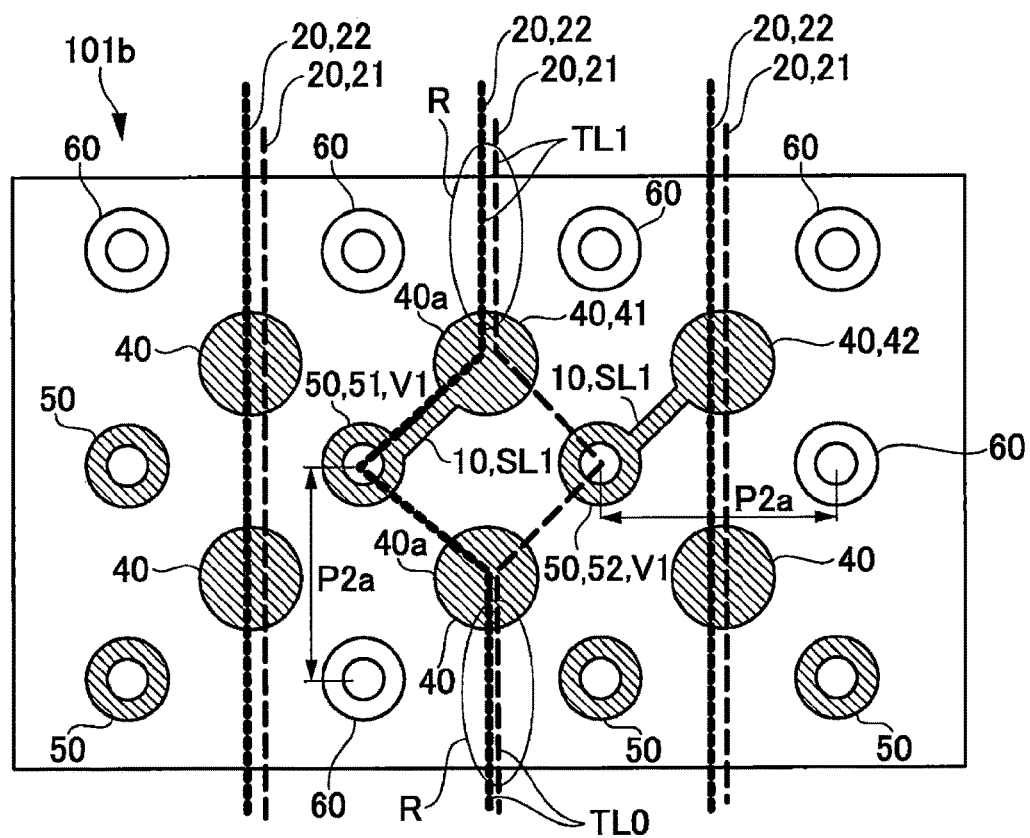
FIG. 6 is a plan view illustrating a wiring structure of the printed wiring board according to a first embodiment.
Figure 7:
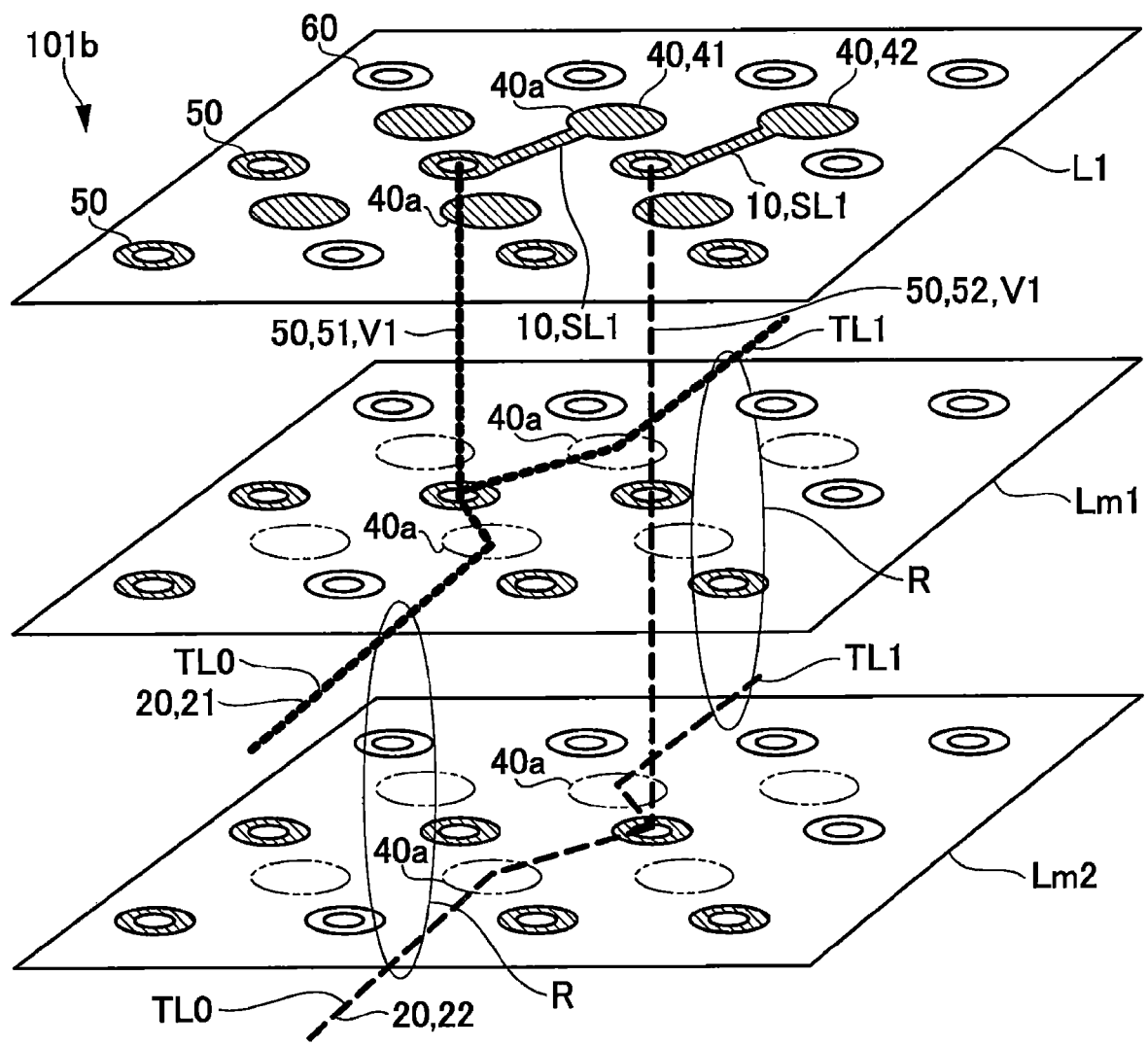
FIG. 7 is an exploded perspective view of a main part illustrating the wiring structure of the printed wiring board in the first embodiment.

FIG. 6 is a plan view illustrating the wiring structure of a printed wiring board according to a first embodiment, and corresponds to an enlarged view of a portion of the connection area 101b in which the conductive pads 40 described with reference to FIG. 5 are arranged. FIG. 7 is an exploded perspective view of the main part illustrating the wiring structure of the printed wiring board in the first embodiment, and is an exploded perspective view of the printed wiring board corresponding to FIG. 6.

FIGS. 6 and 7 illustrate the wiring provided in each layer of the printed wiring board together. The wiring includes the outer-layer wiring 10 formed in the outermost layer of the printed wiring board and the inner-layer wiring 20 formed in the intermediate layer of the printed wiring board. The wiring structure of the printed wiring board according to the first embodiment will be described with reference to FIGS. 3 and 4 above based on FIGS. 6 and 7. In FIGS. 6 and 7, the reference signs of the components identical to those illustrated in FIGS. 3 and 4 are indicated in parentheses.

<Outline of Wiring Path>

First, the outline of a wiring path disposed in the connection area 101b of the printed wiring board will be described. Here, two conductive pads 40 among the plurality of conductive pads 40 provided on the outermost conductive layer L1 among the plurality of conductive layers are set as a pair of a first pad 41 and a second pad 42, and a path of a paired wiring will be described by using a set of wirings connected to the pair of pads as the paired wiring. Therefore, in FIG. 7, illustration of paths of other wirings is omitted.

The first pad 41 and the second pad 42 are connected to a first signal via 51 and a second signal via 52 by the outer-layer wiring 10, respectively. The first pad 41 is connected to the first signal via 51 disposed adjacent to the first pad 41, via the outer-layer wiring 10. The second pad 42 is connected to the second signal via 52 disposed adjacent to the second pad 42, via the outer-layer wiring 10. Here, the phrase of being disposed adjacent means being disposed closest, and the same applies to the following description.

By connecting the first pad 41 and the second pad 42 to the first signal via 51 and the second signal via 52 adjacent to the first pad 41 and the second pad 42 via the outer-layer wiring 10, it is possible to shorten the outer-layer wiring 10. The first signal via 51 and the second signal via 52 are preferably disposed adjacent to each other.

Each outer-layer wiring 10 forms any one of the lead-in wirings SL0 to SL5 (see FIGS. 3 and 4). Here, as an example, each outer-layer wiring 10 is assumed to form the lead-in wiring SL1. In this case, each of the first signal via 51 and the second signal via 52 connected to each outer-layer wiring 10 (the lead-in wiring SL1) functions as the signal transmission via V1 (see FIGS. 3 and 4).

The inner-layer wiring 20 includes a first inner-layer wiring 21 connected to the first signal via 51 and a second inner-layer wiring 22 connected to the second signal via 52, and a set of paired wirings is formed by the first inner-layer wiring 21 and the second inner-layer wiring 22. The first inner-layer wiring 21 and the second inner-layer wiring 22 are disposed in different conductive layers. Here, it is assumed that the first inner-layer wiring 21 is wired in the m1-th conductive layer Lm1 (first conductive layer), and the second inner-layer wiring 22 is wired in the m2-th conductive layer Lm2 (second conductive layer), and the first inner-layer wiring 21 and the second inner-layer wiring 22 are wired in different conductive layers. In such a first inner-layer wiring 21, one side connected to the first signal via 51 (V1) corresponds to the signal line TL0 illustrated in FIGS. 3 and 4, and the other side corresponds to the signal line TL1 illustrated in FIGS. 3 and 4. Similarly, in the second inner-layer wiring 22, one side connected to the first signal via 51 (V1) corresponds to the signal line TL0 illustrated in FIGS. 3 and 4, and the other side corresponds to the signal line TL1 illustrated in FIGS. 3 and 4.

[Common Wiring Route]

Here, it is assumed that the set of paired wirings described above is wired with a common wiring route [R] disposed in a stacked manner in plan view. That is, the first inner-layer wiring 21 and the second inner-layer wiring 22 forming the set of paired wirings are wired to the common wiring route [R] disposed in a stacked manner in plan view, on both sides sandwiching the first signal via 51 and the second signal via 52 connected to the first inner-layer wiring 21 and the second inner-layer wiring 22. Such a common wiring route [R] preferably has a configuration in which the first inner-layer wiring 21 and the second inner-layer wiring 22 are lead out from the first signal via 51 and the second signal via 52 and stacked at positions overlapping the respective adjacent pads 40a adjacent to the first signal via 51 and the second signal via 52.

In the illustrated example, in the paired wiring of the first inner-layer wiring 21 and the second inner-layer wiring 22, the signal lines TL0 provided in the m1-th conductive layer Lm1 and the m2-th conductive layer Lm2 are disposed in an overlapping manner, the signal lines TL1 provided in the m1-th conductive layer Lm1 and the m2-th conductive layer Lm2 are disposed in an overlapping manner, and each of the signal lines TL0 and TL1 forms the common wiring route [R]. In FIG. 6, for easy explanation, the first inner-layer wiring 21 and the second inner-layer wiring 22 in each common wiring route [R] are illustrated at shifted positions. However, the first inner-layer wiring 21 and the second inner-layer wiring 22 may completely coincide with each other in plan view in each common wiring route [R], or may be shifted from each other as illustrated in FIG. 6. In each common wiring route [R], the first inner-layer wiring 21 and the second inner-layer wiring 22 may be disposed to overlap each other to such an extent that insulation can be secured between other signal vias 50 and the stitching vias 60.

Since the arrangement of the signal vias 50 is dense, the common wiring route [R] as described above is provided in the connection area 101b in which more stitching vias 60 are required. The common wiring route [R] may extend outside the connection area 101b, but is assumed to be provided at least in the connection area 101b. It is preferable that an adjacent pad 40a adjacent to each of the first signal via 51 and the second signal via 52 is used as a starting point, and each common wiring route [R] is laid until the common wiring route [R] reaches at least an edge of the connection area 101b. When the common wiring route [R] is assumed to be a route laid between the arrays of the conductive pads 40, the first inner-layer wiring 21 and the second inner-layer wiring 22 are joined to the common wiring route [R] at a position overlapping the adjacent pad 40a disposed closest among the conductive pads 40.

The wiring structure having the common wiring route [R] as described above may be provided in at least one element mounting area 101a among areas in which the memory controller 110 and the memory element 111 to 115 illustrated in FIGS. 3 and 4 are mounted. However, when the wiring structure is provided in at least one element mounting area 101a among the areas in which the memory elements 111 to 115 being the signal receiving elements are mounted, the significant effect is exhibited.

Furthermore, the wiring structure having the common wiring route [R] may be applied to all the signal lines of the multi-drop wiring wired in one element mounting area 101a, or may be applied only to any signal line requiring improvement in waveform quality.

Here, in general, in the printed wiring board using a through-via, it is preferable to dispose a signal line in a conductive layer having a short via stub, that is, a conductive layer far from the outermost conductive layer L1 (see FIG. 7) in the case of a single signal. However, in a parallel bus including a plurality of single-ended signals represented by DDR in which crosstalk between vias becomes apparent, when a conductive layer far from the outermost conductive layer L1 is used, a via length to the outermost conductive layer L1 increases, and the influence of crosstalk increases. Therefore, from the viewpoint of suppressing the crosstalk between the vias, a layer close to the outermost conductive layer L1 (see FIG. 7) is selected as the m1-th conductive layer Lm1 and the m2-th conductive layer Lm2, and the substantial via lengths of the first signal via 51 and the second signal via 52 are shortened, thereby improving the waveform quality, which is preferable. In the case of paired wiring, the first signal line 21 disposed in the m1-th conductive layer Lm1 close to the outermost conductive layer L1 (see FIG. 7) has more favorable waveform quality than the second signal line 22.

[Arrangement of Stitching Vias 60]

Next, the arrangement of the stitching vias 60 in the printed wiring board including the common wiring route [R] as described above will be described. The stitching via 60 is disposed at a position at which the outer-layer wiring 10, the inner-layer wiring 20, and the signal via 50 do not exist. Furthermore, the stitching via 60 is preferably disposed at a position as close as possible to each signal via 50, and as an example, is preferably disposed close to the signal via 50 by a distance of about 1 mm. Furthermore, it is preferable that a plurality of stitching vias 60 are arranged at the above-described distance to each signal via 50.

Figure 8:
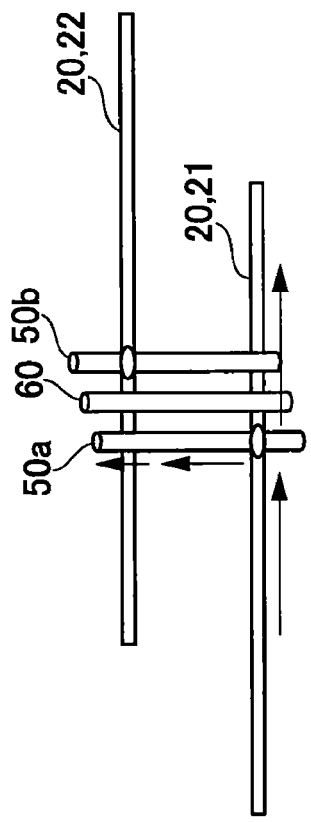
FIG. 8 is a diagram (part 1) for explaining crosstalk between vias.

FIG. 8 is a diagram (part 1) for explaining the crosstalk between vias, and is a diagram for explaining Expression (1) representing the mutual inductance [Lm] that causes crosstalk. In Expression (1) representing the mutual inductance [Lm], a distance between a damaging via 50a and the stitching via 60 is set as d1, a distance between the damaging via 50a and a damaged via 50b is set as d2, a distance between the stitching via 60 and the damaged via 50b is set as d3, the heights of these vias is set as h, the magnetic permeability is set as µ, and the radius of the stitching via 60 is set as R.

As illustrated in FIG. 8, in a configuration in which the stitching via 60 is disposed between the damaging via 50a and the damaged via 50b assumed as the signal vias, a state in which a current flows from the inner-layer wiring 20 to the damaging via 50a in a direction of an arrow in FIG. 8 is assumed. In this case, a fringe electric field F5 is formed around the damaging via 50a. In addition, a return current in a direction opposite to that of the damaging via 50a flows through the stitching via 60 disposed close to the damaging via 50*a*, and thus a fringe electric field F6 in the opposite direction is formed around the stitching via 60.

As represented in Expression (1) in FIG. 8, it is understood that it is possible to reduce the mutual inductance [Lm] causing the crosstalk as the distance between the damaging via 50*a* and the damaged via 50*b*, and the stitching via 60 becomes shorter. In addition, it is understood that the larger the number of the stitching vias 60, the smaller the return current flowing per one stitching via 60, and thus the crosstalk to the damaged via 50*b* is reduced.

[Details of Wiring Layout]

Figure 9:
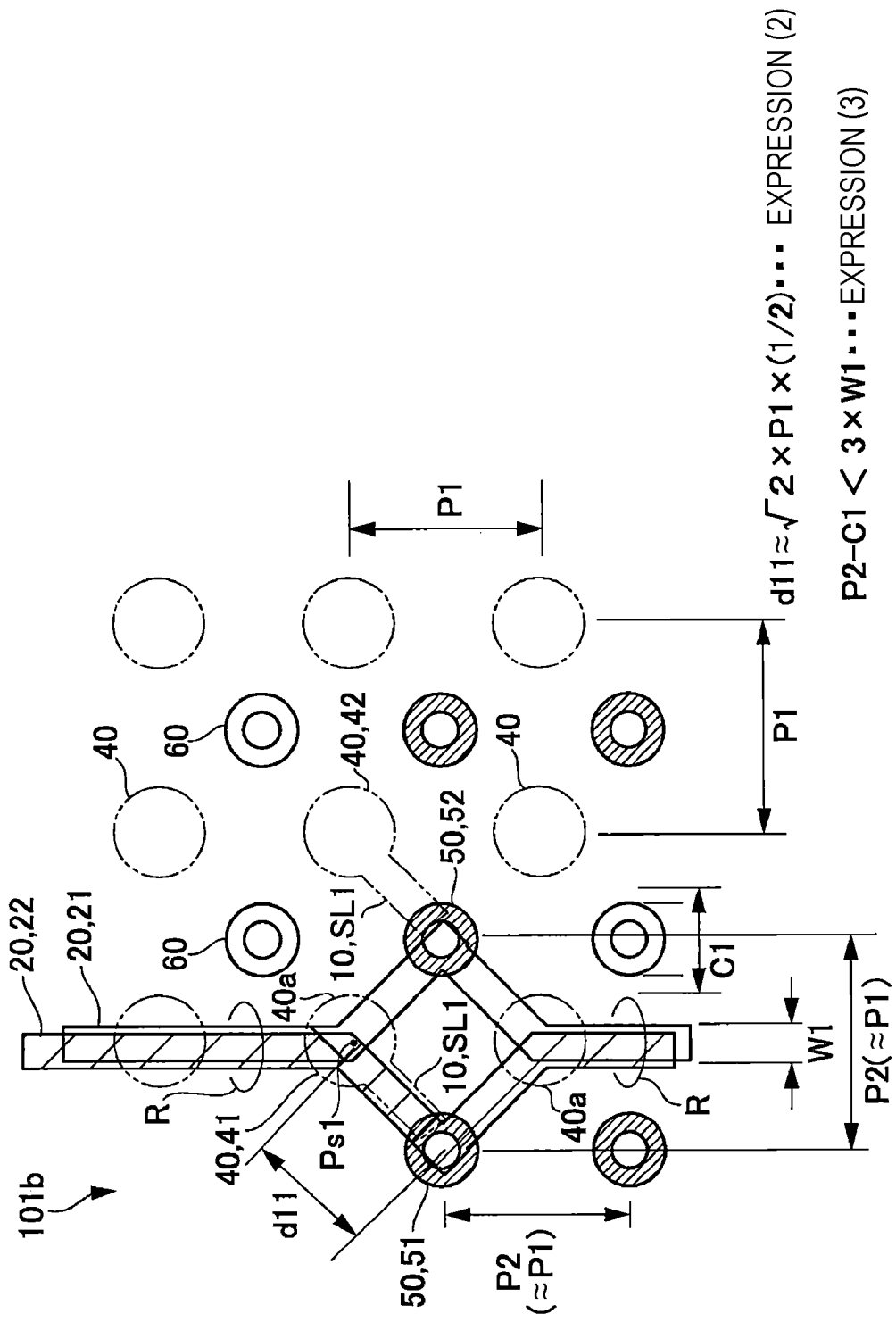
FIG. 9 is a diagram for explaining details of a wiring layout in the element mounting area of the printed wiring board to which the present invention is applied.

FIG. 9 is a diagram for explaining details of a wiring layout in the element mounting area of the printed wiring board to which the present invention is applied, and corresponds to an enlarged view of the main part of FIG. 6. As illustrated in FIG. 9, the element mounting area includes the connection area 101*b* in which the conductive pads 40 are arranged in a matrix. In the connection area 101*b*, the arrangement pitch P1 between the conductive pads 40 is substantially equal to the arrangement pitch P2 between the signal vias 50 and the stitching vias 60.

This is because, as described above with reference to FIG. 5, the elements such as the memory controller and the memory elements mounted on the printed wiring board are the BGA type, and bonding balls are arranged at equal intervals in a matrix on the bottom surface of each element. In this case, one of the signal vias 50 and the stitching vias 60 is disposed at the center of the four conductive pads 40 arranged at the vertexes of the quadrangle among the conductive pads 40 arranged in a matrix in accordance with the arrangement of the bonding balls. With such a layout, when the conductive pads 40 are arranged in a matrix at high density in the connection area 101*b* of the element on which the bonding pads are mounted at high density, it is possible to arrange the signal vias 50 while securing insulation with respect to the conductive pads 40. Furthermore, it is possible to arrange the stitching via 60 at a distance close to the arrangement pitch P2 (≈P1) with respect to the signal via 50. It is preferable that the signal vias 50 are arranged at necessary places among the centers of the four conductive pads 40 arranged at the vertexes of the quadrangle, and the stitching vias 60 are arranged in more other places.

Further, a distance d11 between the center of the signal via 50 and a position Psi at which the inner-layer wiring 20 is far from the common wiring route [R] is substantially equal to √2×P1X (½) (Expression (2)). In other words, the position Psi at which the inner-layer wiring 20 is joined from the signal via 50 to the common wiring route [R] is equivalent to being immediately below the conductive pad 40. The position Psi joined to the common wiring route [R] is also a position at which the inner-layer wiring 20 is far from the common wiring route [R] and the route change is started.

Furthermore, the arrangement pitch P2 between the signal via 50 and the stitching via 60 may be any pitch as long as one inner-layer wiring 20 can be laid between the signal via 50 and the stitching via 60. In other words, the arrangement pitch P2 between the signal via 50 and the stitching via 60 may be short to such an extent that only one inner-layer wiring can be laid between the signal via 50 and the stitching via 60.

Specifically, a condition that a line width W1 of the inner-layer wiring 20 and a clearance diameter C1 of the signal via 50 and the stitching via 60 are set, and only one inner-layer wiring 20 can be laid between the signal via 50 and the stitching via 60 is considered. The clearance diameter C1 is a diameter of the signal via 50 and the stitching via 60 including a gap (clearance) for securing the insulation with respect to the inner-layer wiring 20. The clearance diameter C1 is substantially equal to the diameter of the opening 30*a* in each of the solid film-like conductive films 30 (see FIG. 4).

In this case, the width required for arranging the two inner-layer wirings 20 in parallel is 3×W1, where the gap (interval) required between the inner-layer wirings 20 is set to be substantially equal to the line width W1. Therefore, the condition that only one inner-layer wiring can be laid between the signal via 50 and the stitching via 60 is a case where Expression (3) in FIG. 9 is satisfied. In the connection area 101*b*, the signal via 50 and the stitching via 60 are arranged under such conditions. As a result, the inner-layer wiring 20 forming the common wiring route [R] is preferably wired at a position overlapping each of the solid film-like conductive films 30 (see FIG. 4).

Effects of First Embodiment

[Common Wiring Route [R]]

The printed wiring board in the first embodiment described above has a configuration having the common wiring route [R] in which the inner-layer wirings 20 connected to the two conductive pads 40 via the signal vias 50 are stacked in different conductive layers. With such a configuration, a planar laying area of the inner-layer wiring 20 disposed in the plurality of conductive layers is made compact, and thus it is possible to improve a degree of freedom in arrangement of the stitching vias 60, and arrange the stitching vias 60 close to more signal vias 50. As a result, in the printed wiring board, it is possible to reduce the crosstalk between the signal vias 50, and it is possible to stabilize the operation of the information processing apparatus by providing resistance to various fluctuation elements while having a higher speed and a larger capacity.

In addition, by stacking the first inner-layer wirings 21 and the second inner-layer wirings 22 of different layers in the common wiring route [R] in which the first inner-layer wirings and the second inner-layer wirings are stacked, it is possible to arrange two inner-layer wirings between the adjacent signal vias 50 at the arrangement pitch P2, and wiring to the two conductive pads 40 becomes possible. As a result, it is possible to mount an element in which bonding pads are mounted at high density.

Furthermore, since the layout of the first inner-layer wiring 21 and the second inner-layer wiring 22 can be made common in the common wiring route [R], it is also possible to define labor-saving of design work.

[Leading Position of Inner-Layer Wiring 20]

In particular, the common wiring route [R] in the first embodiment has a configuration in which the first inner-layer wiring 21 and the second inner-layer wiring 22 connected to the first signal via 51 and the second signal via 52 are lead out and stacked at positions overlapping the respective adjacent pads 40*a* adjacent to the first signal via 51 and the second signal via 52. Thus, since the first inner-layer wiring 21 and the second inner-layer wiring 22 can be laid by effectively using the arrangement portion of the conductive pad 40 where the stitching via 60 cannot be arranged, it is possible to further increase the degree of freedom in arrangement of the stitching via 60. As a result, as described below, it is possible to stabilize the operation even at a higher speed and a larger capacity.

Figure 10:
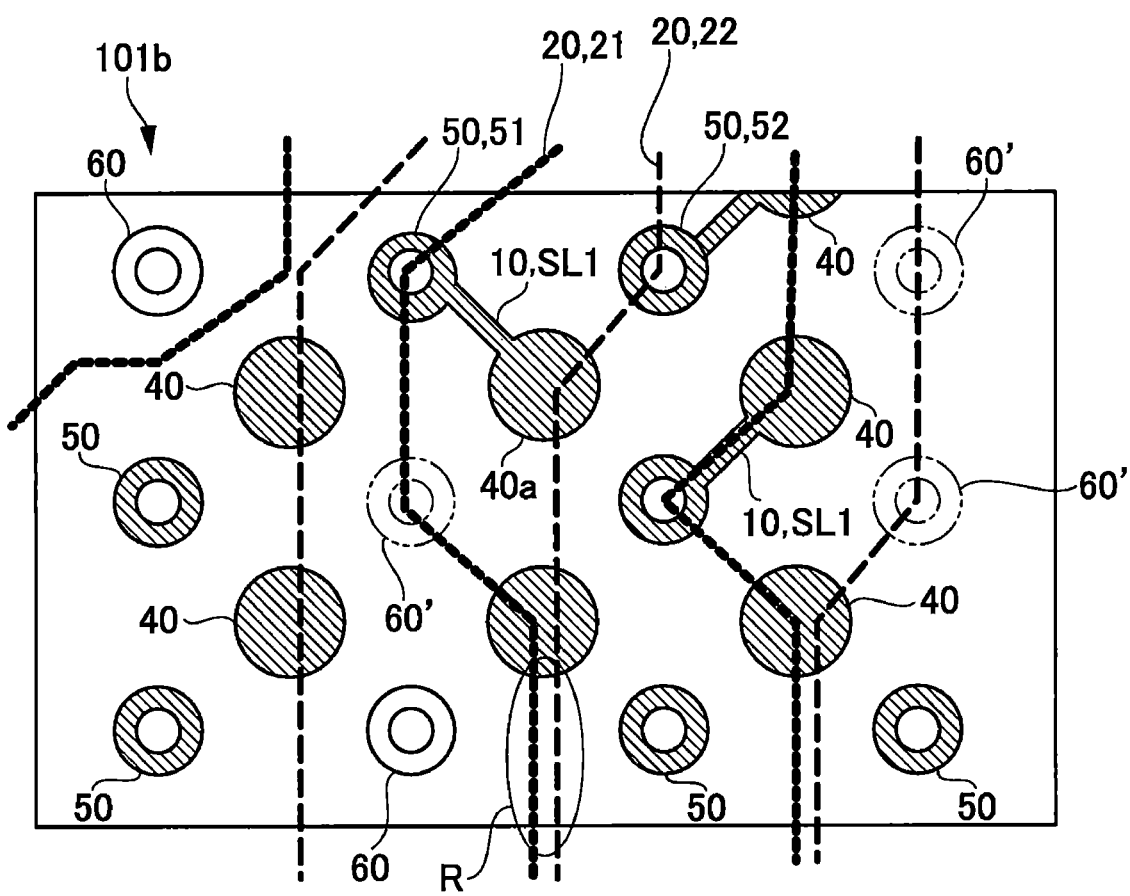
FIG. 10 is a plan view illustrating a wiring structure of a printed wiring board according to a modification example of the first embodiment.

FIG. 10 is a plan view illustrating a wiring structure of a printed wiring board according to a modification example of the first embodiment, and illustrates a configuration in which the first inner-layer wiring 21 forming the common wiring route [R] is not lead out to a position overlapping the adjacent pad 40a adjacent to the first signal via 51. A large number of unarrangeable portions 60' in which the stitching vias 60 cannot be arranged are generated in such a configuration, but, in the configuration of the first embodiment, the generation of the unarrangeable portions 60' is suppressed.

Figure 11:
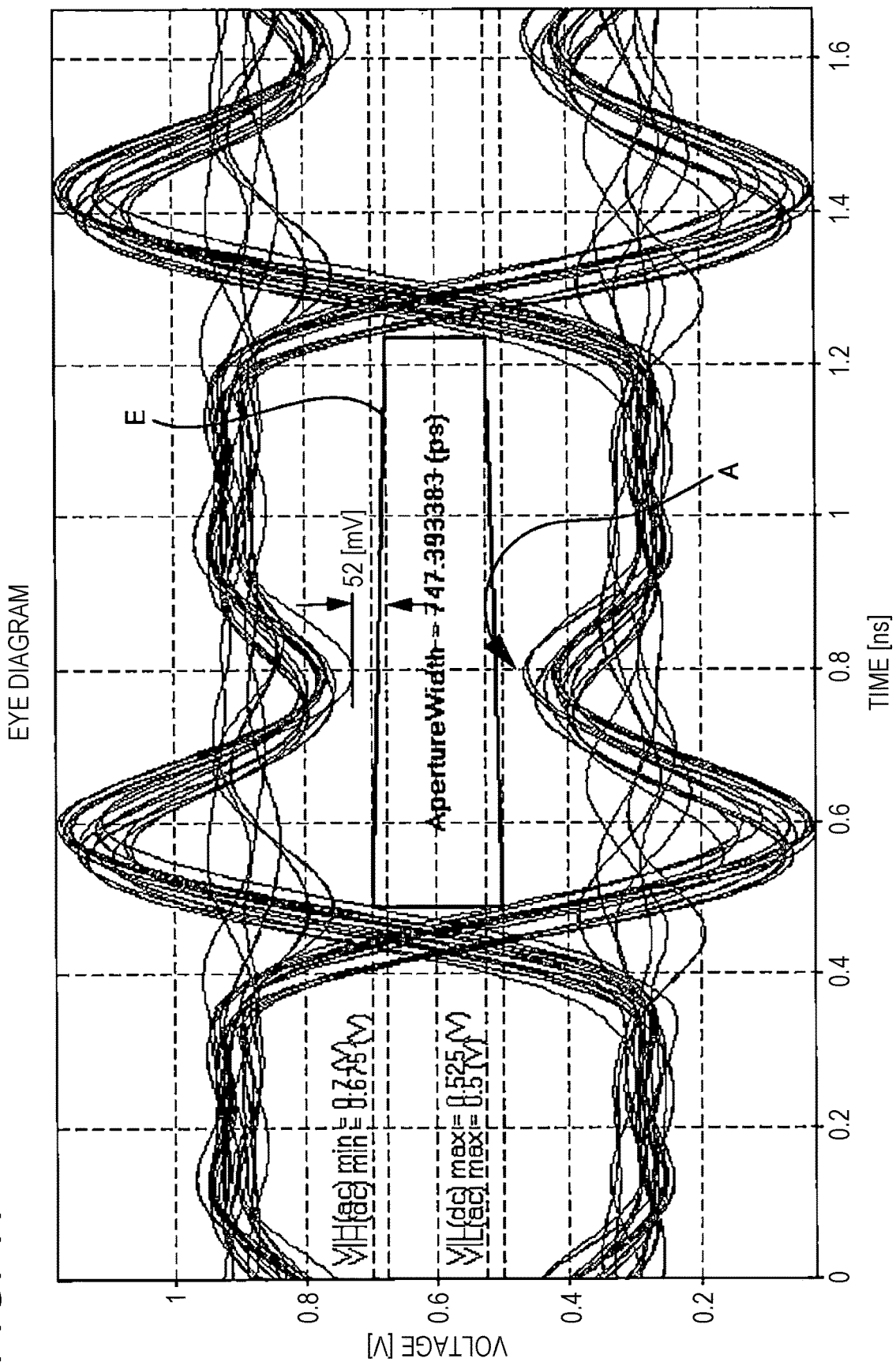
FIG. 11 is a diagram illustrating an eye pattern obtained in the printed wiring board in the first embodiment.
Figure 12:
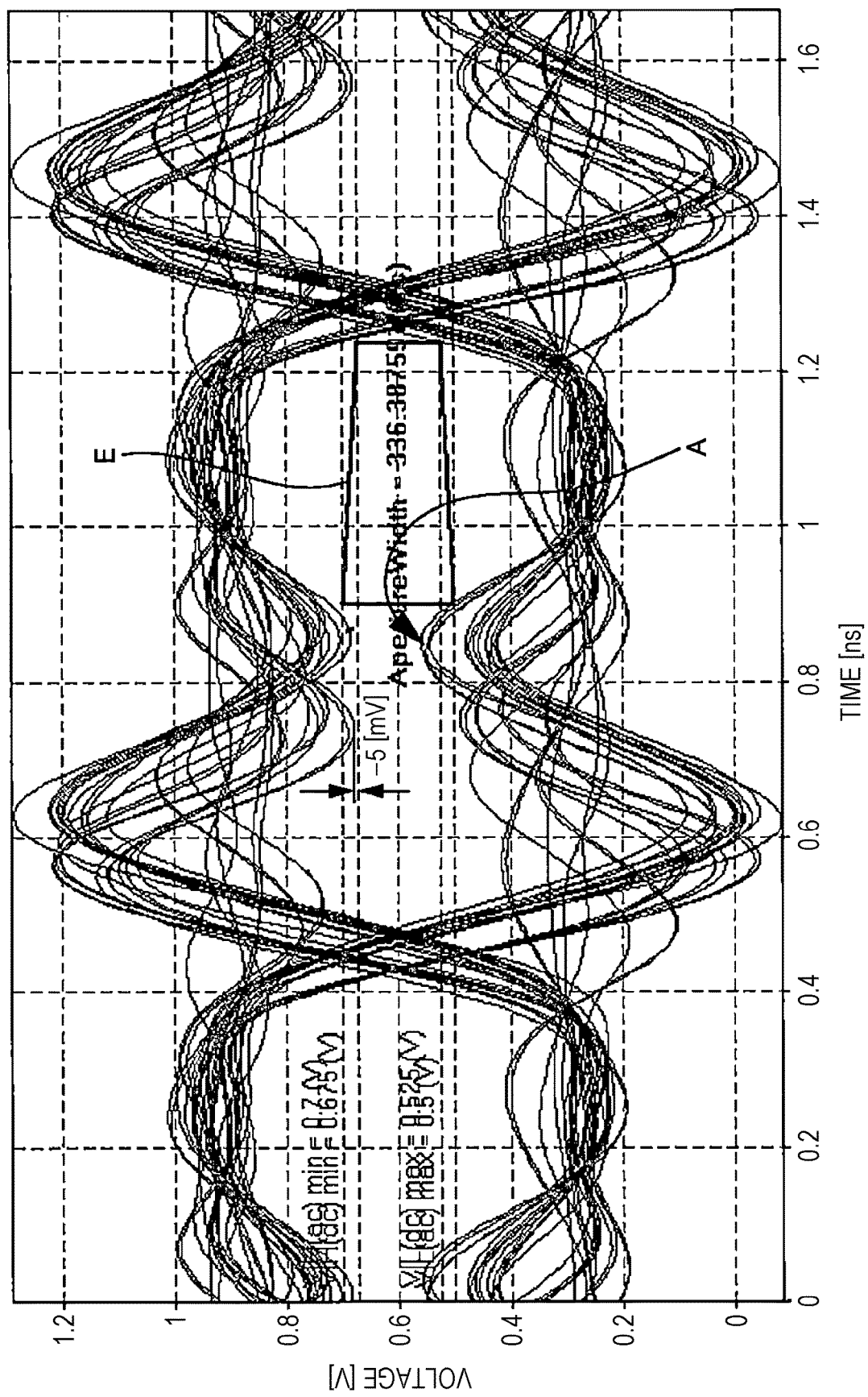
FIG. 12 is a diagram illustrating an eye pattern obtained in the printed wiring board in the modification example of the first embodiment.

FIG. 11 is a diagram illustrating an eye pattern obtained in the printed wiring board in the first embodiment. FIG. 12 is a diagram illustrating an eye pattern obtained in the printed wiring board in the modification example of the first embodiment, and the printed wiring board has the configuration illustrated in FIG. 10. Here, the eye pattern is a pattern in which many transitions of signal waveforms are sampled and superimposed and displayed. In FIGS. 11 and 12, the reception waveform appearing in the signal transmission via V1 is illustrated as the eye pattern. The wider the width of the line in the eye pattern (the more the so-called eye mask [E] is open), the more favorable the quality of the waveform.

In the eye pattern obtained by the configuration to which the first embodiment of FIG. 11 is applied, the eye mask [E] is open as compared with the eye pattern of FIG. 12. That is, in the eye pattern of FIG. 12, the intrusion of ring-back [A] due to crosstalk to the digital threshold is observed. On the other hand, in the eye pattern of FIG. 11, the ring back [A] is suppressed to be small, and the eye mask [E] is in a state of being largely opened. Comparing the voltage margins of the eye mask [E] in FIGS. 11 and 12, the voltage margin is 52 [mV] in FIG. 11, but the voltage margin is −5 [mV] in FIG. 12. As a result, it is understood that the voltage margin of the eye mask [E] can be secured by applying the first embodiment, and the waveform quality is favorable. Therefore, with the configuration of the first embodiment, it is possible to arrange the stitching via 60 close to the signal via 50, so that it is understood that the crosstalk is reduced and the waveform quality can be improved.

[Laying Layer of Inner-Layer Wiring 20]

In the printed wiring board having the common wiring route [R] in the first embodiment, the first inner-layer wiring 21 and the second inner-layer wiring 22 forming the common wiring route [R] are conductive layers close to the outermost conductive layer L1 (see FIG. 7) on which the element is mounted. As a result, it is possible to reduce the substantial via lengths of the first signal via 51 and the second signal via 52 and improve the waveform quality.

Figure 13:
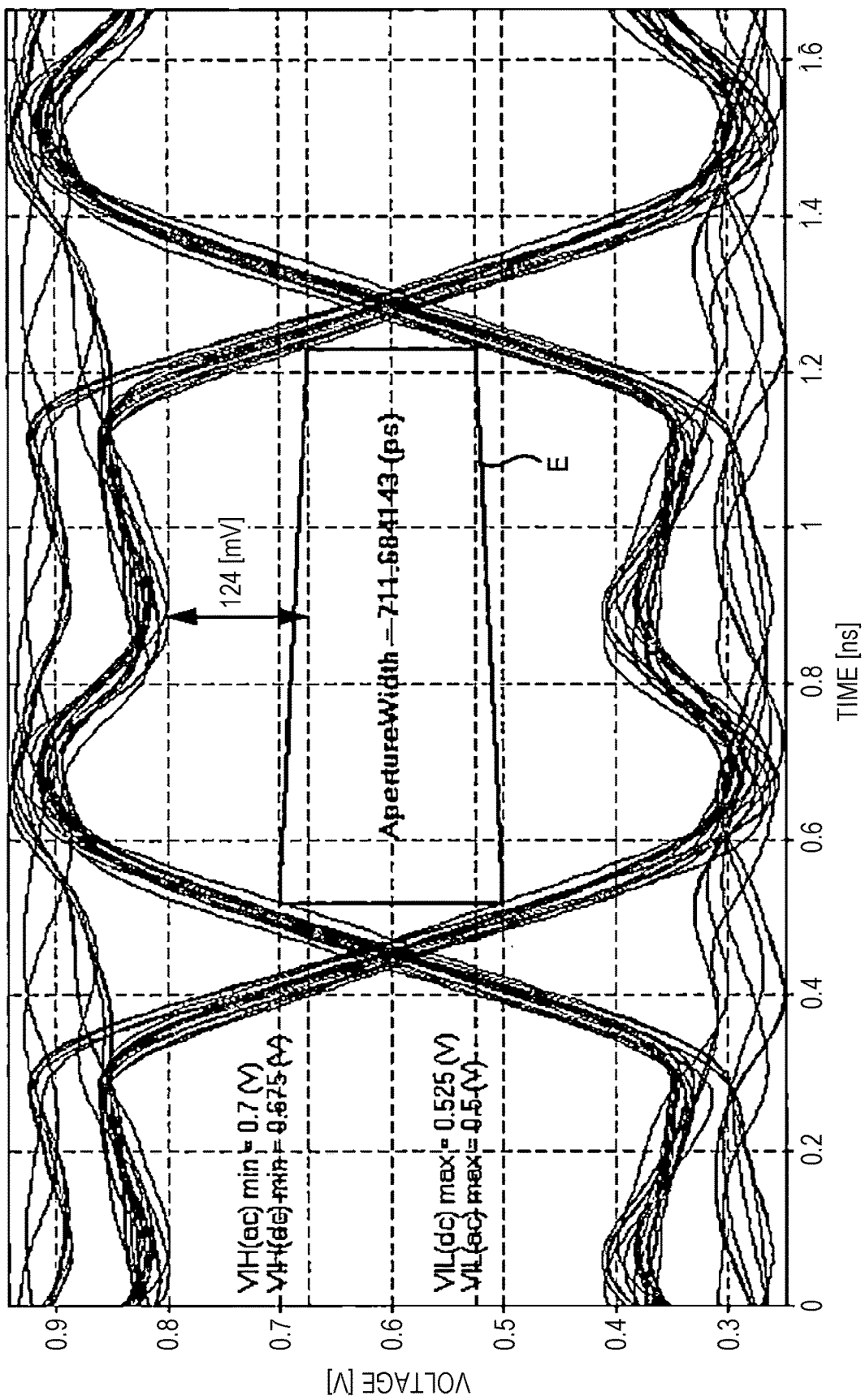
FIG. 13 is a diagram illustrating an eye pattern obtained when a third layer of the printed wiring board in the first embodiment is used.
Figure 14:
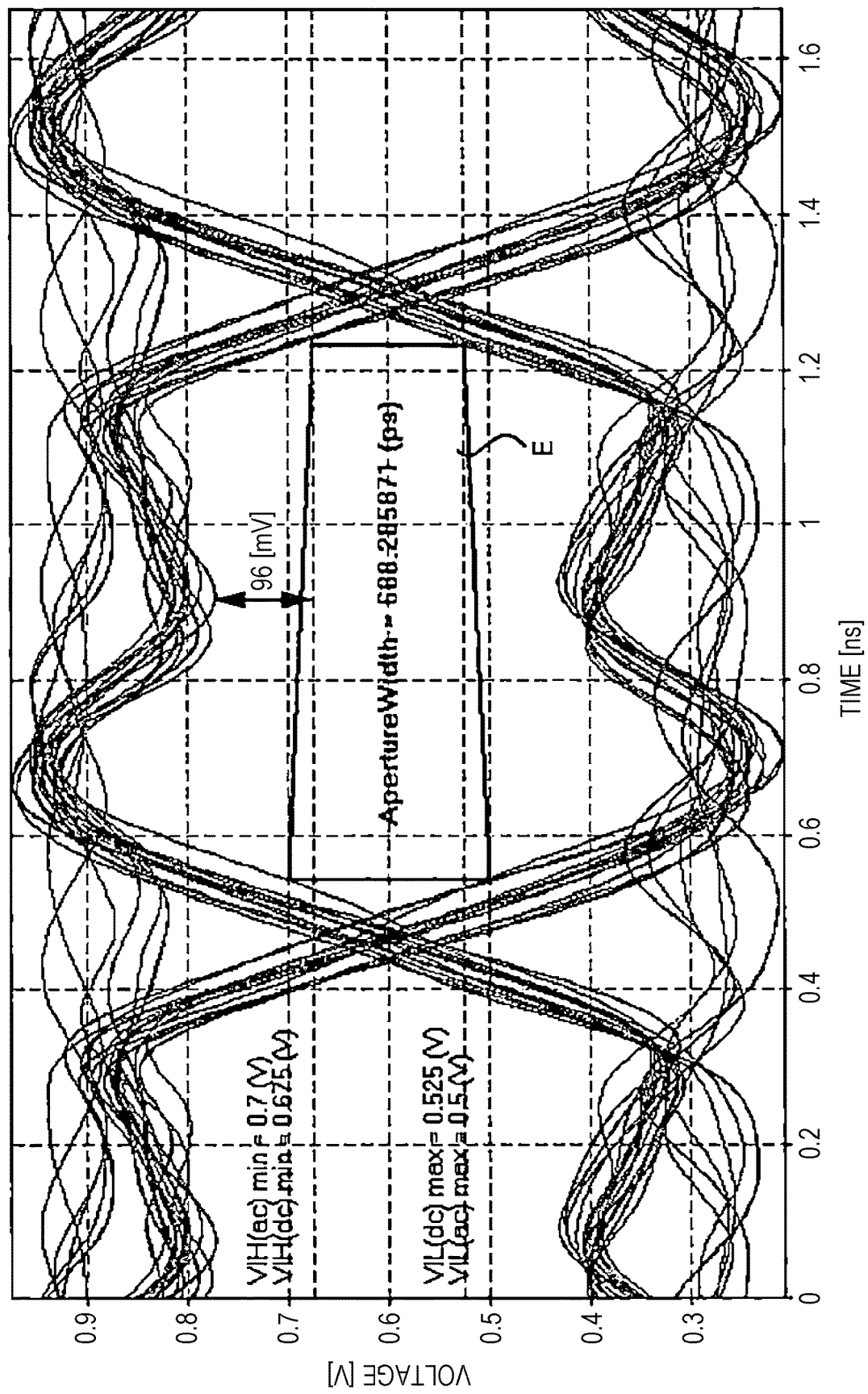
FIG. 14 is a diagram illustrating an eye pattern obtained when a tenth layer of the printed wiring board in the first embodiment is used.

FIG. 13 is a diagram illustrating an eye pattern obtained when a third layer of the printed wiring board in the first embodiment is used, and illustrates a reception waveform appearing in the first signal via 51 illustrated in FIG. 7 as an eye pattern (signal A). FIG. 14 is a diagram illustrating an eye pattern obtained when a tenth layer of the printed wiring board in the first embodiment is used, and illustrates a reception waveform appearing in the second signal via 52 illustrated in FIG. 7 as an eye pattern (signal B). When comparing the eye patterns of FIG. 13 and FIG. 14, it is understood that the signal A of FIG. 13 in which the via length from the inner-layer wiring 20 to the outermost conductive layer L1 on which the element is mounted is shorter has a larger voltage margin of the eye mask [E] and more favorable waveform quality than the signal B of FIG. 14 in which the via length is longer. Thus, by arranging the first inner-layer wiring 21 and the second inner-layer wiring 22 forming the common wiring route [R] in the conductive layer close to the outermost conductive layer L1 (see FIG. 7) on which the element is mounted, it is possible to suppress the crosstalk with respect to the surrounding signal vias 50 when a large number of signals change simultaneously.

Each of the effects as described above realizes a stable operation of an element having resistance to a fluctuation element such as a power supply voltage variation of a computer that controls various facilities, an ambient temperature change, and manufacturing variation of an element to be mounted. In addition, the configurations of the first embodiment and the modification example can be realized by a commonly used VIA method, and do not increase the difficulty in manufacturing the printed wiring board.

The first embodiment and the modification example described above are not limited to the application of the multi-drop wiring structure to a printed wiring board. However, among the signals forming the DDR, the multi-drop wiring applied to the signal line of the address, the command, and the control signal is accompanied by a plurality of branches and loads, and thus is easily accompanied by waveform distortion due to unnecessary reflection. In addition, the wiring length is longer than that of a data wiring, and crosstalk noise (Far-end crosstalk: FEXT) superimposed from a nearby signal becomes apparent. Therefore, when fluctuation elements such as power supply voltage fluctuation, temperature change, and element manufacturing variation are added, the digital signal cannot be normally received. Therefore, the configurations of the first embodiment and the modification example can obtain the significant effect in the application to the multi-drop wiring. In the first embodiment and the modification example described above, the SDRAM is used as a signal receiving device, but the signal receiving device may be another device.

Furthermore, in the first embodiment and the modification example described above, the configuration in which the signal vias 50 are disposed between the arrangements of the conductive pads 40 has been described. However, the present invention can also be applied to a configuration in which the signal via 50 is disposed at a position overlapping the signal via 50 and the conductive pad 40. In this case, for example, when described with reference to FIG. 9, the outer-layer wiring 10 (the lead-in wiring SL1) may not be provided, the common wiring route [R] is laid between stacked layers of the signal vias and the conductive pads, and the stitching vias 60 are disposed at positions not overlapping with the signal vias 50 and the conductive pads 40.

Second Embodiment

Figure 15:
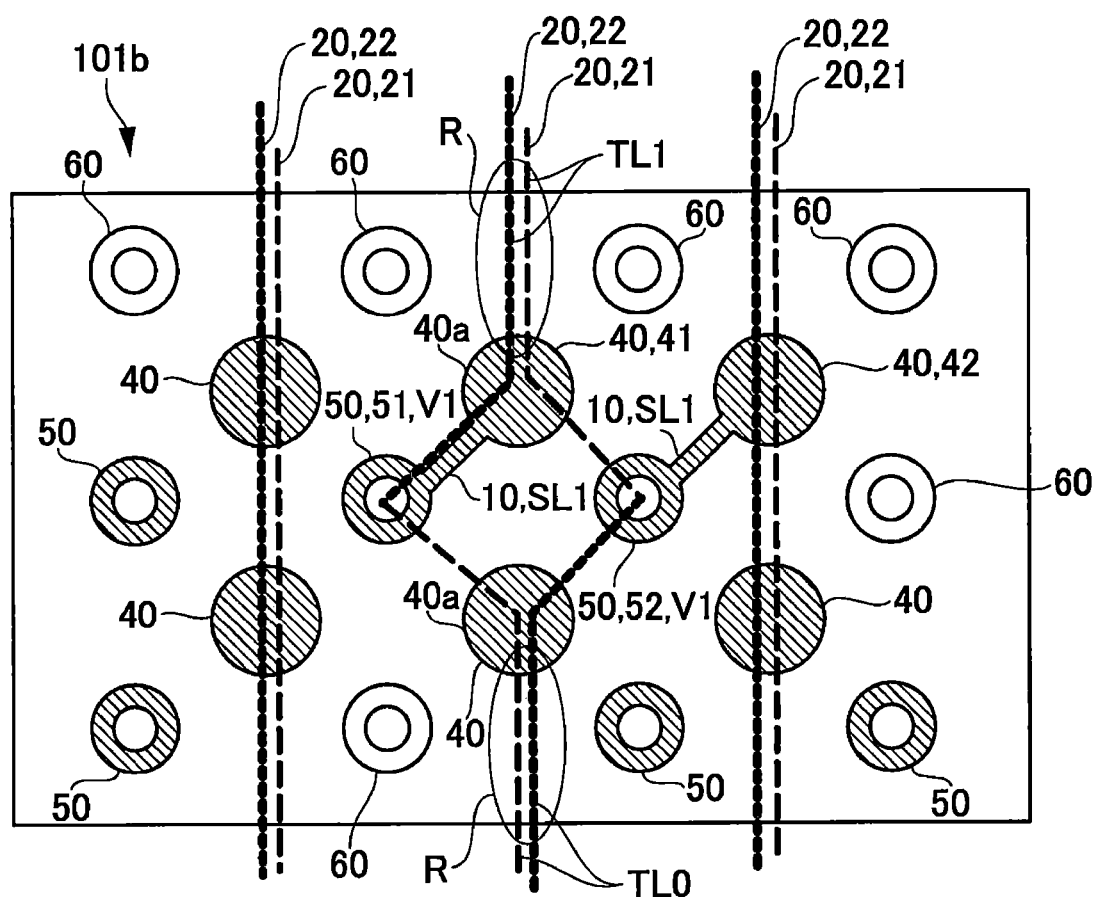
FIG. 15 is a plan view illustrating a wiring structure of a printed wiring board according to a second embodiment.
Figure 16:
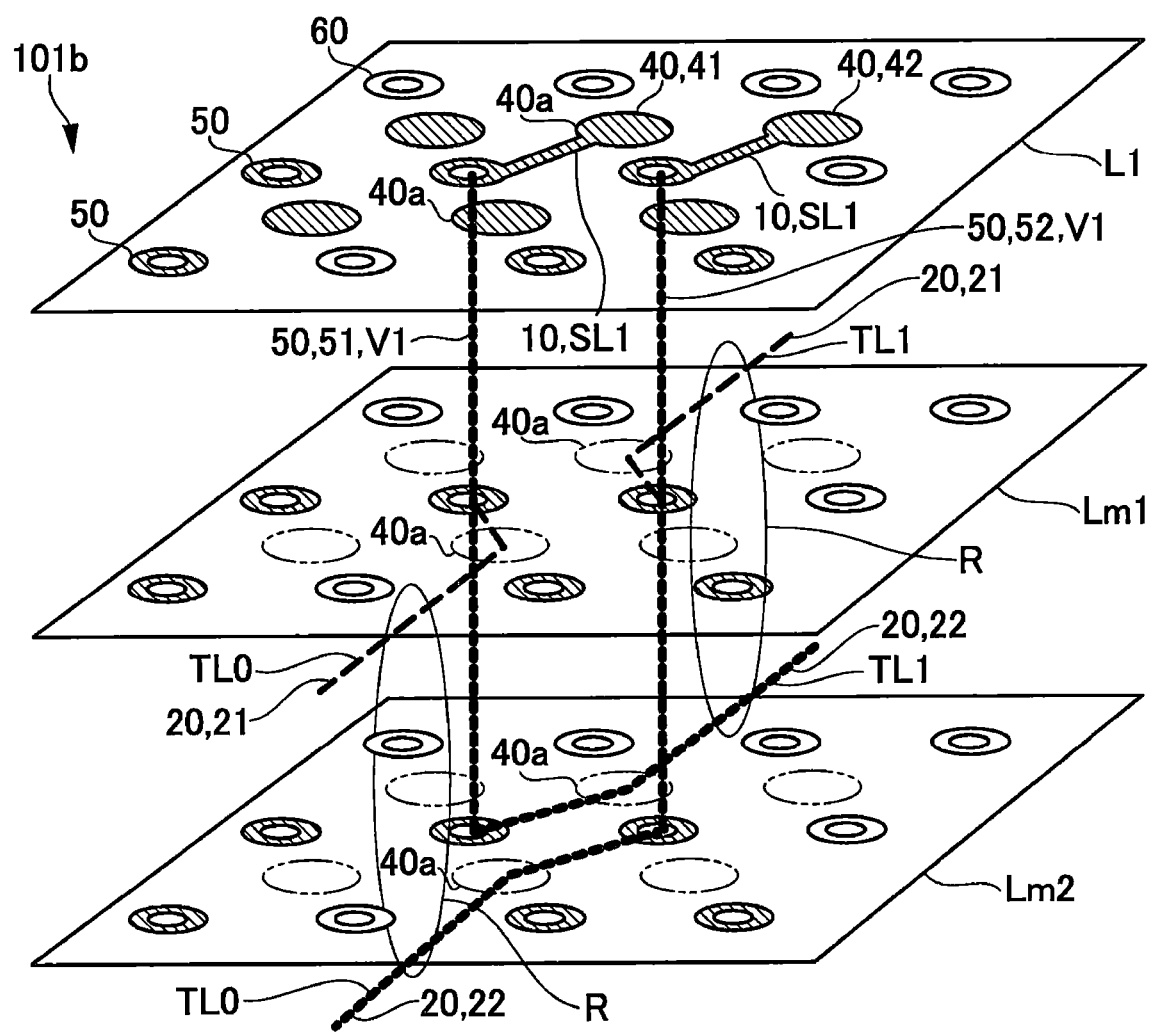
FIG. 16 is an exploded perspective view of a main part illustrating the wiring structure of the printed wiring board in the second embodiment.

FIG. 15 is a plan view illustrating the wiring structure of a printed wiring board according to a second embodiment, and corresponds to an enlarged view of a portion of the connection area 101b in which the conductive pads 40 described with reference to FIG. 5 are arranged. FIG. 16 is an exploded perspective view of the main part illustrating the wiring structure of the printed wiring board in the second embodiment, and is an exploded perspective view of the printed wiring board corresponding to FIG. 15.

FIGS. 15 and 16 illustrate the wiring provided in each layer of the printed wiring board together. The wiring includes the outer-layer wiring 10 formed in the outermost conductive layer of the printed wiring board and the inner-layer wiring 20 formed in the intermediate layer of the printed wiring board. The wiring structure of the printed wiring board according to the second embodiment will be described with reference to FIGS. 3 and 4 above based on FIGS. 15 and 16. In FIGS. 15 and 16, the reference signs of the components identical to those illustrated in FIGS. 3 and 4 are indicated in parentheses.

<Outline of Wiring Path>

The wiring path of the printed wiring board in the second embodiment illustrated in FIGS. 15 and 16 is different from the wiring path of the printed wiring board in the first embodiment described with reference to FIGS. 6 and 7 in that the paired wiring forming the common wiring route [R] is subjected to layer exchange via the signal via 50, and other configurations are similar. Here, the layer exchange means that the conductive layers wired are interchanged in the middle. Two conductive pads 40 among the plurality of conductive pads 40 provided on the outermost conductive layer L1 among the plurality of conductive layers are set as a pair of a first pad 41 and a second pad 42, and a path of a paired wiring will be described below by using a set of wirings connected to the pair of pads as the paired wiring.

The first pad 41 and the second pad 42 are connected to a first signal via 51 and a second signal via 52 by the outer-layer wiring 10, respectively. The first pad 41 is connected to the first signal via 51 disposed adjacent to the first pad 41, via the outer-layer wiring 10. The second pad 42 is connected to the second signal via 52 disposed adjacent to the second pad 42, via the outer-layer wiring 10. The above points are similar to those of the first embodiment.

The outer-layer wiring 10 forms any one of the lead-in wirings SL0 to SL5 (see FIGS. 3 and 4). Here, as an example, each outer-layer wiring 10 is assumed to form the lead-in wiring SL1. In this case, each of the first signal via 51 and the second signal via 52 connected to each outer-layer wiring 10 functions as the signal transmission via V1 (see FIGS. 3 and 4) connected to the lead-in wiring SL1. This point is also similar to that of the first embodiment.

The inner-layer wiring 20 includes, for example, the first inner-layer wiring 21 wired in the m1-th conductive layer Lm1 and the second inner-layer wiring 22 wired in the m2-th conductive layer Lm2. The first inner-layer wiring 21 and the second inner-layer wiring 22 are connected to the first signal via 51 connected to the first pad 41. The first inner-layer wiring 21 and the second inner-layer wiring 22 are also connected to the second signal via 52 connected to the second pad 42. In this point, the configuration is different from that of the first embodiment.

In this case, the first inner-layer wiring 21 connected to the first signal via 51 corresponds to the signal line TL0 illustrated in FIGS. 3 and 4, and the second inner-layer wiring 22 connected to the first signal via 51 corresponds to the signal line TL1 illustrated in FIGS. 3 and 4. The first inner-layer wiring 21 connected to the second signal via 52 corresponds to the signal line TL1 illustrated in FIGS. 3 and 4, and the second inner-layer wiring 22 connected to the second signal via 52 corresponds to the signal line TL0 illustrated in FIGS. 3 and 4.

[Common Wiring Route]

Here, it is assumed that the set of paired wirings connected to the first pad 41 and the second pad 42 described above is wired with a common wiring route [R] disposed in a stacked manner in plan view. The common wiring route [R] is similar to the configuration described in the first embodiment.

In the common wiring route [R], the paired wirings are wired by layer exchange via the signal vias 50, and the conductive layers are interchanged. That is, the signal lines TL0 and TL1 connected to the first signal via 51 are changed in layer from the first inner-layer wiring 21 to the second inner-layer wiring 22 in the first signal via 51. The signal lines TL0 and TL1 connected to the second signal via 52 are changed in layer from the second inner-layer wiring 22 to the first inner-layer wiring 21 in the second signal via 52. In these two common wiring routes [R], the signal lines TL0 and TL1 connected to the first signal via 51 and the signal lines TL0 and TL1 connected to the second signal via 52 are in a state of layer exchange. In addition, due to this layer exchange, the first signal via 51 and the second signal via 52 are in a section in which the direction of the current is opposite.

The above layer exchange structure is preferably performed between the adjacent signal vias 50. Furthermore, the layer exchange structure may be applied to all the signal lines of the multi-drop wiring wired in one element mounting area 101a, or may be applied only to any signal line requiring improvement in waveform quality. Furthermore, the above layer exchange structure may be applied to all the signal lines connected to the signal transmission vias V0 to V6 illustrated in FIGS. 3 and 4, or may be applied only to the signal lines connected to any signal via whose waveform quality is desired to be improved.

Effects of Second Embodiment

The printed wiring board in the second embodiment described above has a configuration in which the first inner-layer wiring 21 and the second inner-layer wiring 22 connected to the first signal via 51 and the second signal via 52 are subjected to layer exchange in the first signal via 51 and the second signal via 52 in the configuration of the first embodiment. As a result, the printed wiring board of the second embodiment can more effectively reduce the crosstalk between the signal vias 50 as compared with the printed wiring board in the first embodiment.

Figure 17:
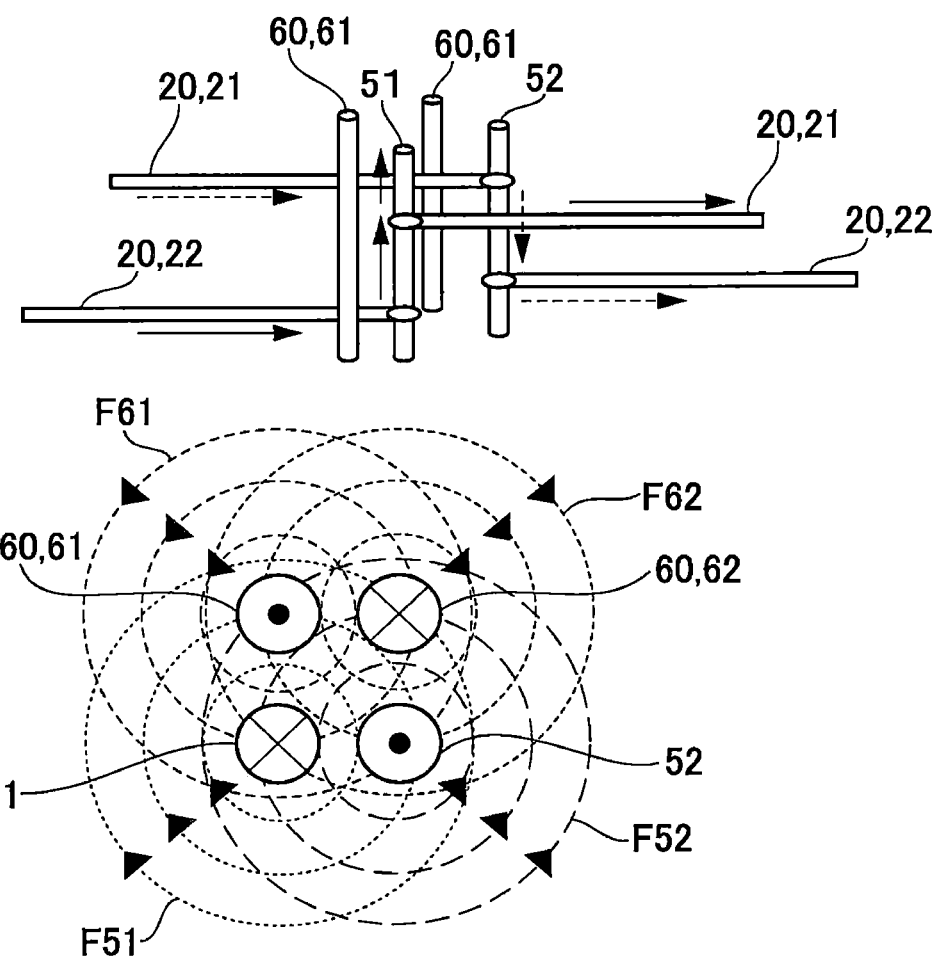
FIG. 17 is a diagram (part 2) for explaining crosstalk between vias.

FIG. 17 is a diagram (part 2) for explaining crosstalk between vias. FIG. 17 illustrates a configuration in which the stitching via 60 is disposed adjacent to the first signal via 51 and the second signal via 52 for layer exchange of the paired wiring. As illustrated in FIG. 17, when a signal is transmitted by a paired wiring including the first inner-layer wiring 21 and the second inner-layer wiring 22, the first signal via 51 and the second signal via 52 become damaging vias, and a current flows in opposite directions in the first signal via 51 and the second signal via 52 as indicated by arrows in FIG. 17.

Then, fringe electric fields F51 and F52 in opposite directions are formed around the first signal via 51 and the second signal via 52 through which the current flows. The return current in the direction opposite to the first signal via 51 flows through the stitching via 61 disposed close to the first signal via 51, and thus a fringe electric field F51 in a direction opposite to a fringe electric field F61 is formed around the stitching via 61. Similarly, a return current in a direction opposite to the second signal via 52 flows through the stitching via 62 disposed close to the second signal via 52, and thus a fringe electric field F62 in a direction opposite to the fringe charge F52 is formed around the stitching via 62.

As described above, the fringe magnetic fields of the first signal via 51 and the second signal via 52 paired with the fringe magnetic fields of the stitching vias 61 and 62 disposed close to each other are directed to cancel each other, and thus it is possible to reduce the influence of the crosstalk on the surrounding signal via 50. As a result, when a large number of signals change simultaneously, it is possible to more effectively suppress crosstalk with respect to the surrounding signal vias 50.

Figure 18:
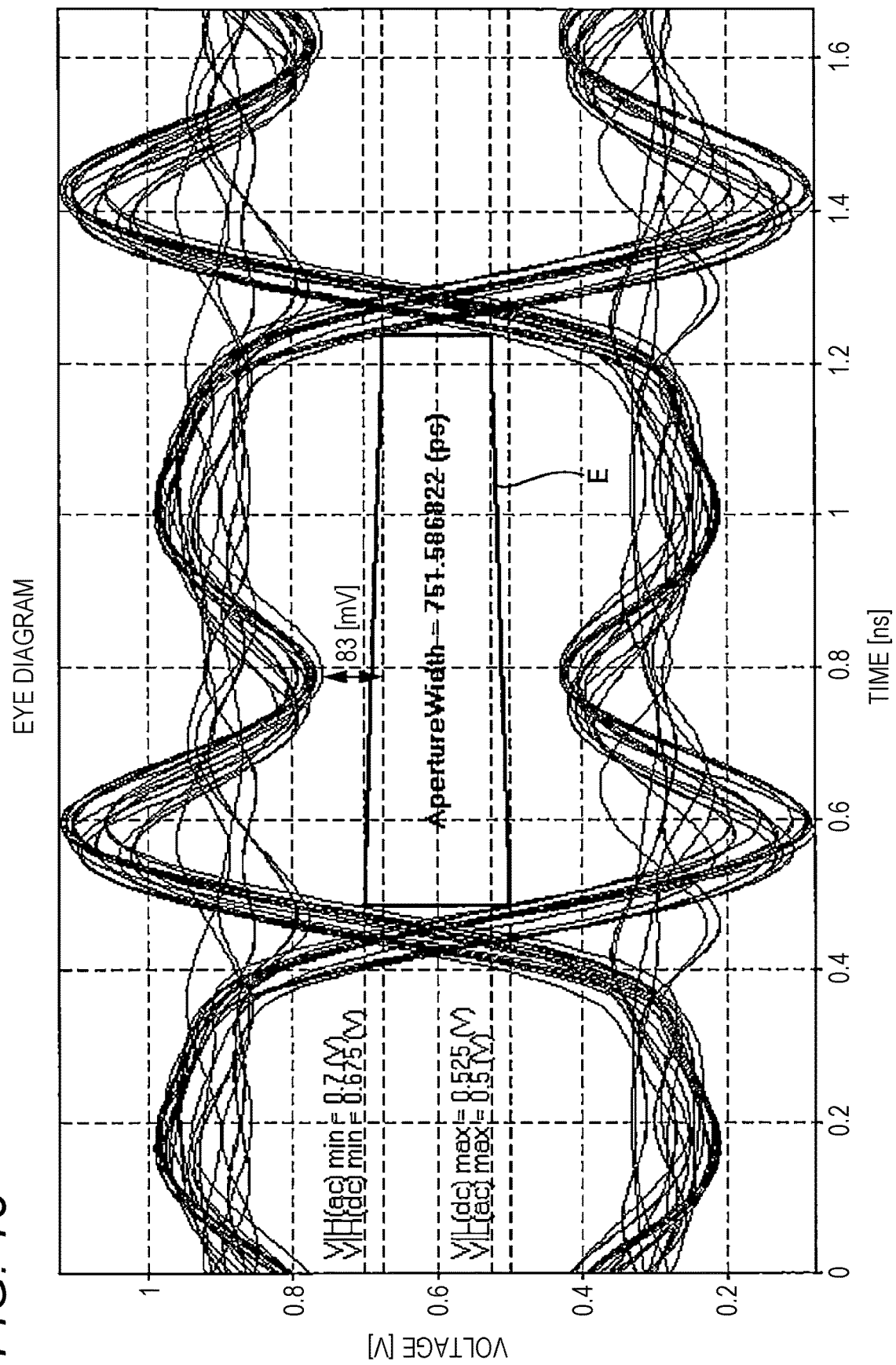
FIG. 18 is a diagram illustrating an eye pattern obtained in the printed wiring board in the second embodiment.

FIG. 18 is a diagram illustrating an eye pattern obtained in the printed wiring board in the second embodiment. The printed wiring board from which the eye pattern is obtained has a configuration (FIG. 16) in which the signal line TL1 connected to the first signal via 51 and the signal line TL1 connected to the second signal via 52 are subjected to layer exchange in the configuration (see FIG. 7) from which the eye pattern of FIG. 11 is obtained.

Comparing FIG. 18 with FIG. 11, the voltage margin from the threshold in the eye mask [E] is 52 [mV] in FIG. 11, but the voltage margin is 83 [mV] in FIG. 18, and the voltage margin is increased. As a result, it is understood that, by applying the second embodiment to the common wiring route [R] described in the first embodiment and performing layer exchange, crosstalk is further suppressed, the above-described ring back is alleviated, and the waveform quality is improved.

Figure 19:
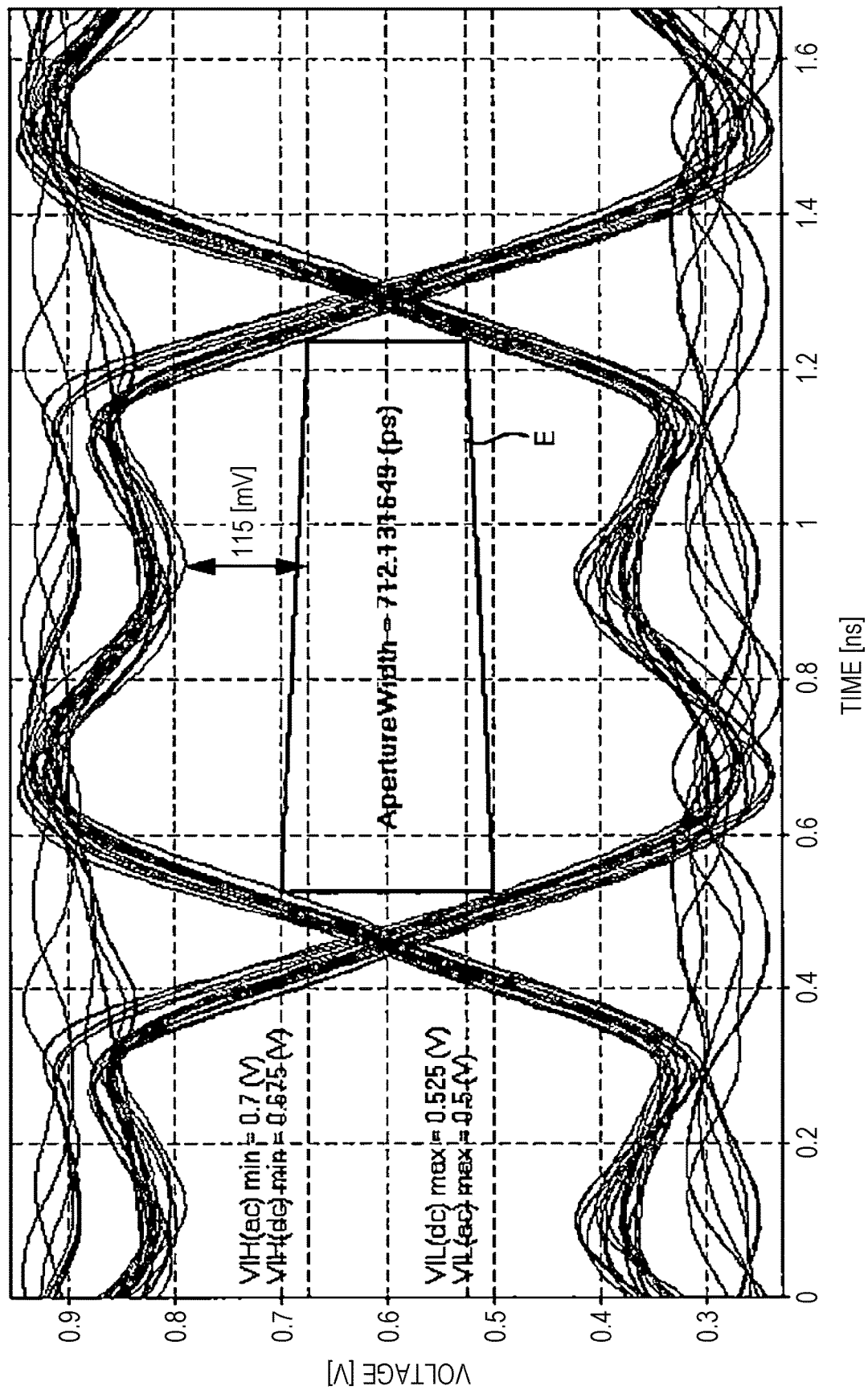
FIG. 19 is a diagram (part 1) illustrating an eye pattern obtained when layer exchange is performed between a third layer and a tenth layer of the printed wiring board in the second embodiment.
Figure 20:
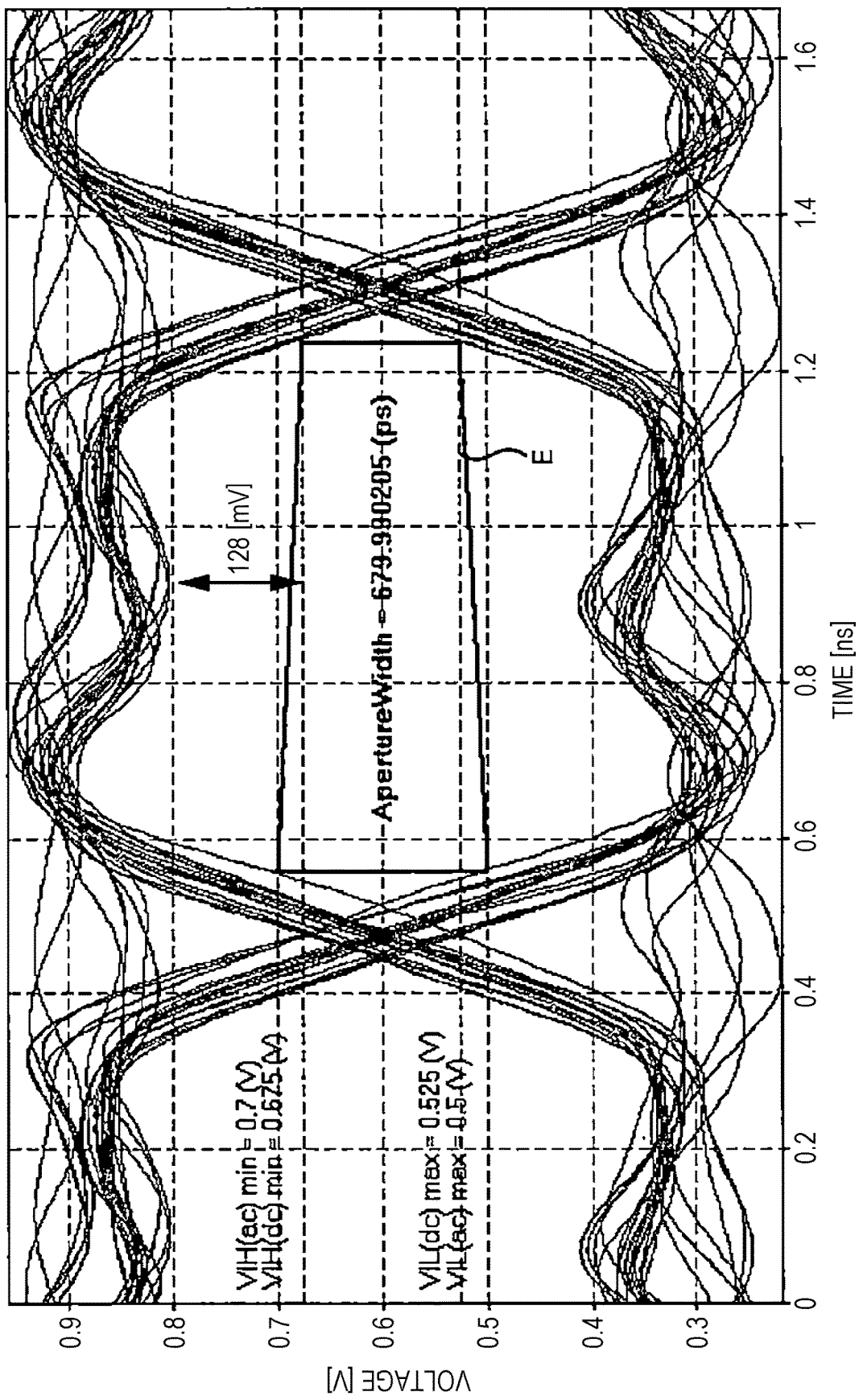
FIG. 20 is a diagram (part 2) illustrating the eye pattern obtained when the layer exchange is performed between the third layer and the tenth layer of the printed wiring board in the second embodiment.

FIG. 19 is a diagram (part 1) illustrating an eye pattern obtained when layer exchange between the third layer and the tenth layer of the printed wiring board in the second embodiment is performed, and illustrates a reception waveform appearing in the first signal via 51 illustrated in FIG. 16 as an eye pattern (signal A). FIG. 20 is a diagram (part 2) illustrating an eye pattern obtained when layer exchange between the third layer and the tenth layer of the printed wiring board in the second embodiment is performed, and illustrates a reception waveform appearing in the second signal via 52 illustrated in FIG. 16 as an eye pattern (signal B). In this case, the m1-th conductive layer Lm1 in FIG. 16 is the third layer of the conductive layer, and the m2-th conductive layer Lm2 is the tenth layer of the conductive layer.

When these eye patterns of FIGS. 19 and 20 are compared with the eye patterns obtained from the printed wiring boards of FIGS. 13 and 14 in which the layer exchange is not performed, it is understood that the difference in voltage margin between the signal A and the signal B is smaller in the eye patterns of FIGS. 19 and 20. As a result, it is understood that it is possible to reduce the difference in waveform quality between the signals A and B having the same threshold by performing layer exchange between the layers of the inner-layer wiring 20 sharing the common wiring route [R] in the adjacent signal vias 50.

The present invention is not limited to the embodiments and the modification examples described above, and various modification examples may be further provided. For example, the above embodiments have been described in detail in order to explain the present invention in an easy-to-understand manner, and the above embodiments are not necessarily limited to a case including all the described configurations. Further, some components in one embodiment can be replaced with the components in another embodiment, and the configuration of another embodiment can be added to the configuration of one embodiment. Regarding some components in the embodiments, other components can be added, deleted, and replaced.

What is claimed is:

1. A printed wiring board comprising:
   an outermost conductive layer that includes a plurality of conductive pads;
   a first conductive layer that includes a first inner-layer wiring and is stacked on the outermost conductive layer;
   a second conductive layer that includes a second inner-layer wiring and is stacked on the outermost conductive layer and the first conductive layer;
   a first signal via that connects one of the conductive pads and the first inner-layer wiring with each other;
   a second signal via connecting another one of the conductive pads and the second inner-layer wiring with each other; and
   a stitching via that is connected to a ground,
   wherein the first inner-layer wiring and the second inner-layer wiring form a common wiring route in which the first inner-layer wiring and the second inner-layer wiring are stacked and disposed in a connection area in which the conductive pads are arranged,
   wherein the conductive pads are arranged in a matrix at a predetermined arrangement pitch in the connection area, and
   wherein an interval between the first signal via and the second signal via is substantially equal to the predetermined arrangement pitch.

2. The printed wiring board according to claim 1, wherein a plurality of the stitching vias are arranged at an interval substantially equal to the predetermined arrangement pitch with respect to at least one of the first signal via and the second signal via.

3. The printed wiring board according to claim 1, wherein the first signal via, the second signal via, and the stitching via are disposed between arrays of the plurality of conductive pads,
   each of the first signal via and the second signal via is connected to one of the plurality of conductive pads by an outer-layer wiring provided in the outermost conductive layer, and
   the first inner-layer wiring and the second inner-layer wiring are joined to the common wiring route at a position overlapping a conductive pad, among the conductive pads, disposed closest to the first inner-layer wiring and the second inner-layer wiring.

4. The printed wiring board according to claim 3, wherein the common wiring route is laid to pass through the position overlapping the conductive pad.

5. The printed wiring board according to claim 1, wherein the first signal via is connected only to the first inner-layer wiring, and
   the second signal via is connected only to the second inner-layer wiring.

6. The printed wiring board according to claim 1, wherein the first signal via is connected to a signal line including the first inner-layer wiring and the second inner-layer wiring,
   the second signal via is connected to a signal line including the second inner-layer wiring and the first inner-layer wiring, and
   the two signal lines are wired to be interchanged between the first conductive layer and the second conductive layer in the first signal via and the second signal via.

7. The information processing apparatus comprising:
   a printed wiring board according to claim 1, and an element mounted on the printed wiring board.

8. An information processing apparatus comprising:
   a printed wiring board; and
   an element mounted on the printed wiring board,
   wherein the printed wiring board includes:
   an outermost conductive layer that includes a plurality of conductive pads connected to the element;
   a first conductive layer that includes a first inner-layer wiring and is stacked on the outermost conductive layer;
   a second conductive layer that includes a second inner-layer wiring and is stacked on the outermost conductive layer and the first conductive layer;

a first signal via that connects one of the conductive pads and the first inner-layer wiring with each other;

a second signal via connecting another one of the conductive pads and the second inner-layer wiring with each other; and a stitching via that is connected to a ground, wherein the first inner-layer wiring and the second inner-layer wiring form a common wiring route in which the first inner-layer wiring and the second inner-layer wiring are stacked and disposed in a connection area in which the conductive pads are arranged, wherein the conductive pads are arranged in a matrix at a predetermined arrangement pitch in the connection area, and wherein an interval between the first signal via and the second signal via is substantially equal to the predetermined arrangement pitch.

* * * * *